United States Patent
Maekawa

(10) Patent No.: US 9,530,819 B2
(45) Date of Patent: Dec. 27, 2016

(54) MANUFACTURING METHOD OF SEMICONDUCTOR INTEGRATED CIRCUIT DEVICE

(71) Applicant: Renesas Electronics Corporation, Kawasaki-shi (JP)

(72) Inventor: Kazuyoshi Maekawa, Kawasaki (JP)

(73) Assignee: RENESAS ELECTRONICS CORPORATION, Kawasaki-Shi, Kanagawa (JP)

( * ) Notice: Subject to any disclaimer, the term of this patent is extended or adjusted under 35 U.S.C. 154(b) by 0 days.

(21) Appl. No.: 14/797,099

(22) Filed: Jul. 11, 2015

(65) Prior Publication Data

US 2016/0043133 A1 Feb. 11, 2016

(30) Foreign Application Priority Data

Aug. 6, 2014 (JP) ................. 2014-160003

(51) Int. Cl.
*H01L 21/00* (2006.01)
*H01L 27/146* (2006.01)

(52) U.S. Cl.
CPC ..... *H01L 27/14687* (2013.01); *H01L 27/1464* (2013.01); *H01L 27/14621* (2013.01); *H01L 27/14623* (2013.01); *H01L 27/14627* (2013.01); *H01L 27/14636* (2013.01); *H01L 27/14645* (2013.01); *H01L 27/14685* (2013.01)

(58) Field of Classification Search
CPC ............. H01L 27/14643; H01L 27/14603; H01L 27/1462; H01L 27/14687; H01L 2924/12043
See application file for complete search history.

(56) References Cited

U.S. PATENT DOCUMENTS

| 5,404,005 A | * | 4/1995 | Shimomura ...... H01L 27/14621 |
| | | | 250/208.1 |
| 7,754,557 B2 | | 7/2010 | Park |
| 2005/0085087 A1 | | 4/2005 | Okigawa et al. |

FOREIGN PATENT DOCUMENTS

| JP | 2002-324899 A | 11/2002 |
| JP | 2005-072260 A | 3/2005 |
| JP | 2009-010387 A | 1/2009 |
| JP | 2009-130111 A | 6/2009 |
| JP | 2012-023319 A | 2/2012 |

* cited by examiner

*Primary Examiner* — Zandra Smith
*Assistant Examiner* — John M Parker
(74) *Attorney, Agent, or Firm* — McGinn IP Law Group, PLLC.

(57) ABSTRACT

A solid-state imaging element has problems of occurrence of dark current due to influences of an interface state at an interface between a semiconductor and an insulating film, e.g., between silicon and silicon oxide, and of charges generated in a device manufacturing process, which leads to signal noise, thereby degrading the function of a device, specifically, the imaging quality. The outline of the invention in the present application relates to a manufacturing method of a semiconductor integrated circuit device with a surface-irradiation type image sensor, which includes irradiating a main surface of a semiconductor wafer with photodiodes formed therein, with far-ultraviolet ray after forming a lowermost wiring layer of a multi-layer wiring and before forming a color filter layer, and then applying a heat treatment to the wafer.

12 Claims, 29 Drawing Sheets

MANUFACTURING METHOD OF SEMICONDUCTOR INTEGRATED CIRCUIT DEVICE

CROSS-REFERENCE TO RELATED APPLICATIONS

The disclosure of Japanese Patent Application No. 2014-160003 filed on Aug. 6, 2014 including the specification, drawings and abstract is incorporated herein by reference in its entirety.

BACKGROUND

The present application relates to a manufacturing method of a semiconductor integrated circuit device (or a semiconductor device) and the like, and more specifically, a technique that can be applied to a semiconductor integrated circuit device and the like with a semiconductor imaging element.

Japanese Unexamined Patent Application Publication No. 2012-23319 (Patent Document 1) relates to a complementary metal oxide semiconductor (CMOS) image sensor, and the like. This patent document discusses the problems associated with a manufacturing process of a surface-irradiation type CMOS image sensor or the like, including occurrence of dark current etc., due to an increase in interface state or level that would be caused by irradiation of ultraviolet rays accompanied by a plasma treatment. Here, a method for reducing the interface level is disclosed which uses bonding of hydrogen detached from a passivation film (SiN film) deposited on a metal wiring, to a dangling bond on the surface of a semiconductor substrate. Further, it is also disclosed that by increasing a hydrogen content of the P—SiN film, the bonding efficiency of the dangling bond is improved.

Japanese Unexamined Patent Application Publication No. 2009-130111 (Patent Document 2) relates to a CMOS image sensor or the like. This patent document discloses that dangling bonds (crystal defects) occur in crystals due to irradiation of ultraviolet ray accompanied by dry etching or the like in a manufacturing process of a surface-irradiation type CMOS image sensor or the like. Further, thermal energy is applied to a semiconductor substrate with such crystal defects, generating carriers to cause a white scratch or roughness, as disclosed therein. Regarding recovery of these crystal defects, it is described that a damage recovery process, such as a heat treatment or hydrogen termination, is difficult to perform in a stage where a wiring or a color filter is already formed over the substrate. Further, a method for reducing the crystal defects is disclosed which involves recovering damage to the internal structure of the crystals by a heat treatment at a temperature of 800° C. to 1000° C., or terminating a dangling bond with a Si—H bond by a hydrogen treatment.

Japanese Unexamined Patent Application Publication No. 2005-72260 (Patent Document 3), or U.S. Unexamined Patent Application Publication No. 2005-85087 (Patent Document 4) corresponding to the above Japanese patent document relates to a charge coupled device (CCD) image sensor or the like. This patent document discloses that regarding a manufacturing process of the CCD image sensor or the like, dry etching using a fluorocarbon gas involves irradiating a wafer to be processed, with ultraviolet rays in a wide spectrum range from around 150 nm to around 350 nm.

Japanese Unexamined Patent Application Publication No. 2002-324899 (Patent Document 5) also relates to a CCD image sensor or the like. This patent document discloses a process, regarding a manufacturing process of the CCD image sensor or the like, which prevents formation of a silicon nitride film in a region for formation of a light receiving portion, while suppressing the occurrence of dark current or white scratches by imparting a sufficient hydrogen annealing effect. That is, it is disclosed that after a silicon nitride film is deposited as a hydrogen-containing film by a plasma CVD method, low-temperature annealing (at 380° C.) is performed on the silicon nitride film, followed by selectively removing a part of the silicon nitride film located in the formation region for the light receiving portion.

Japanese Unexamined Patent Application Publication No. 2009-10387 (Patent Document 6), or U.S. Pat. No. 7,754,557 (Patent Document 7) corresponding to the above Japanese patent document also relates to a CMOS image sensor or the like. This patent document discloses that regarding a manufacturing process of a surface-irradiation type CMOS image sensor or the like, a protective oxide film and a protective nitride film are laminated in this order after etching an upper wiring metal layer, and then the hydrogen annealing is performed on the films at 400° C. in order to reduce dark current. Further, as disclosed therein, in the same situation, a protective film is formed after forming an uppermost metal layer, and the hydrogen annealing is performed on the film at a temperature of 400° C. to 435° C.

RELATED ART DOCUMENTS

Patent Documents

[Patent Document 1]
  Japanese Unexamined Patent Application Publication No. 2012-23319
[Patent Document 2]
  Japanese Unexamined Patent Application Publication No. 2009-130111
[Patent Document 3]
  Japanese Unexamined Patent Application Publication No. 2005-72260
[Patent Document 4]
  U.S. Unexamined Patent Application Publication No. 2005-85087
[Patent Document 5]
  Japanese Unexamined Patent Application Publication No. 2002-324899
[Patent Document 6]
  Japanese Unexamined Patent Application Publication No. 2009-10387
[Patent Document 7]
  U.S. Pat. No. 7,754,557

SUMMARY

A solid-state imaging element has problems of occurrence of dark current due to influences of an interface state at an interface between a semiconductor and an insulating film, for example, between silicon and silicon oxide, and of charges generated in a device manufacturing process, which leads to signal noise, thereby degrading the function of a device, specifically, the imaging quality.

Means for solving these problems and the like will be described below, and other problems and new features of the present invention will be clarified from the description of the present specification and the accompanied drawings.

The outline of representative embodiments disclosed in the present application will be briefly described as follows.

That is, the outline of one embodiment in the present application is directed to a manufacturing method of a semiconductor integrated circuit device with a surface-irradiation type image sensor, which includes irradiating a main surface of a semiconductor wafer with photodiodes formed therein, with far-ultraviolet ray after forming a lowermost wiring layer of a multi-layer wiring layer and before forming a color filter layer, and then applying a heat treatment to the wafer.

Effects obtained by the representative embodiments disclosed in the present application will be briefly described as follows.

That is, according to the one embodiment of the invention in the present application, dark current and the like in an image sensor can be reduced.

DETAILED DESCRIPTION

Outline of Embodiments

Figure 1:
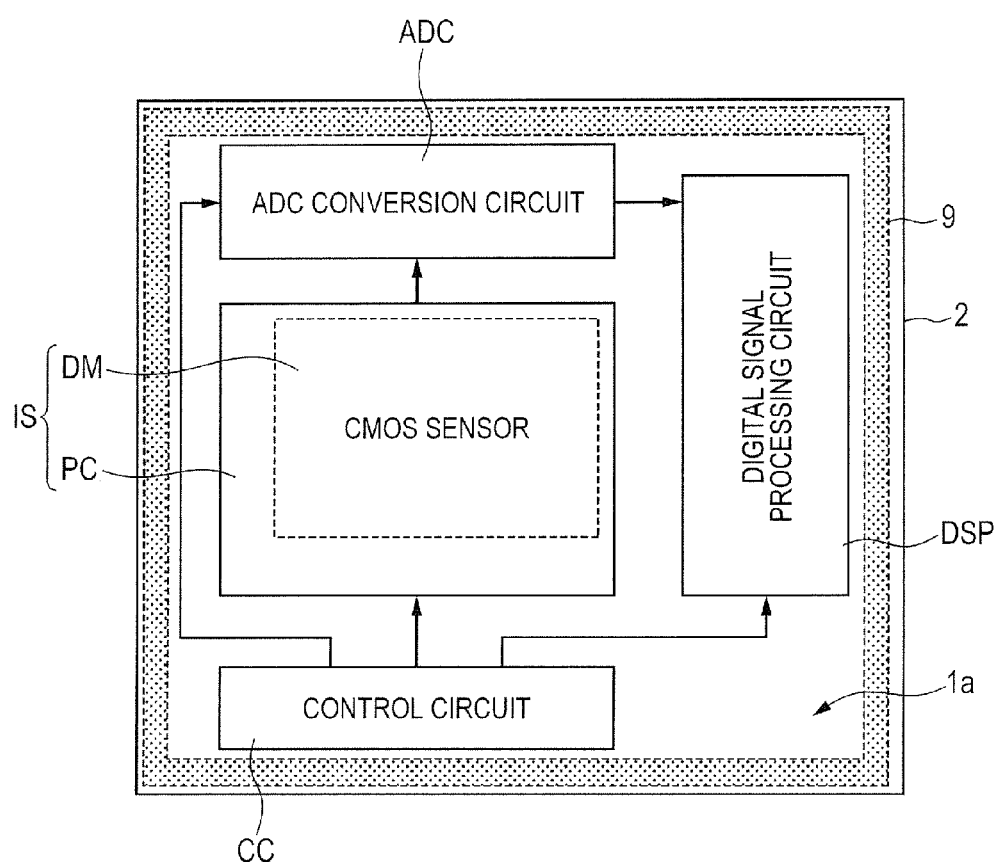
FIG. 1 is a circuit configuration diagram of an upper surface of an entire chip for explaining an example of a circuit configuration or the like of a CMOS chip that includes a CMOS image sensor obtained by a manufacturing method of a semiconductor integrated circuit device according to one embodiment of the present application.

First, the outline of representative embodiments disclosed in the present application will be described below.

1.

A method for manufacturing a semiconductor integrated circuit device according to one embodiment of the present invention includes the steps of: (a) providing a semiconductor wafer with numerous chip regions, the semiconductor wafer having numerous photodiodes formed in a matrix at a semiconductor region in a first main surface of the semiconductor wafer in each of the chip regions so as to configure a surface-irradiation type image sensor; (b) after the step (a), forming a multi-layer wiring layer over the first main surface of the semiconductor wafer; and (c) after the step (b), forming a color filter layer over the multi-layer wiring layer. Here, the step (b) includes sub-steps of: (b1) forming a first wiring layer included in the multi-layer wiring layer; (b2) after the step (b1), irradiating the first main surface of the semiconductor wafer with far-ultraviolet ray; and (b3) after the step (b2), applying a heat treatment to the semiconductor wafer.

2.

In the manufacturing method of the semiconductor integrated circuit device according to Item 1, the far-ultraviolet ray has a wavelength range of less than 250 nm.

3.

In the manufacturing method of the semiconductor integrated circuit device according to Item 1 or 2, the step (b2) is performed under reduced-pressure atmosphere.

4.

In the manufacturing method of the semiconductor integrated circuit device according to Item 3, a range of atmospheric pressure under the reduced-pressure atmosphere is equal to or more than 1 kilopascal and less than 70 kilopascals.

5.

In the manufacturing method of the semiconductor integrated circuit device according to any one of Items 1 to 4, a range of a treatment temperature of the heat treatment is equal to or more than 300° C. and less than 450° C.

6.

In the manufacturing method of the semiconductor integrated circuit device according to any one of Items 1 to 5, the heat treatment is performed under a reducing atmosphere containing hydrogen as a principal reducing gas component.

7.

A method for manufacturing a semiconductor integrated circuit device according to another embodiment of the present invention includes the steps of: (a) providing a semiconductor wafer with numerous chip regions, the semiconductor wafer having numerous photodiodes arranged in a matrix in each of the chip regions so as to configure a backside-irradiation type image sensor; (b) forming a multi-layer wiring layer over a first main surface of the semiconductor wafer; (c) after the steps (a) and (b), forming a first insulating film over a second main surface of the semiconductor wafer; (d) after the step (c), depositing a light shielding film over the first insulating film; (e) patterning the light shielding film; (f) after the step (e), forming a second insulating film over the second main surface of the semiconductor wafer; and (g) forming a color filter layer over the second insulating film. Here, the step (f) includes sub-steps of: (f1) depositing the second insulating film; (f2) patterning at least the second insulating film; (f3) after the step (f2), irradiating the second main surface of the semiconductor wafer with far-ultraviolet ray; and (f4) after the step (f3), applying a heat treatment to the semiconductor wafer.

8.

In the manufacturing method of the semiconductor integrated circuit device according to Item 7, the far-ultraviolet ray has a wavelength range of less than 250 nm.

9.

In the manufacturing method of the semiconductor integrated circuit device according to Item 7 or 8, the step (f3) is performed under reduced-pressure atmosphere.

10.

In the manufacturing method of the semiconductor integrated circuit device according to Item 9, a range of atmospheric pressure under the reduced-pressure atmosphere is equal to or more than 1 kilopascal and less than 70 kilopascals.

11.

In the manufacturing method of the semiconductor integrated circuit device according to any one of Items 7 to 10, a range of a treatment temperature of the heat treatment is equal to or more than 300° C. and less than 450° C.

12.

In the manufacturing method of the semiconductor integrated circuit device according to any one of Items 7 to 11, the heat treatment is performed under a reducing atmosphere containing hydrogen as a principal reducing gas component.

Explanation of Description Format, Basic Terms, and Usage in Present Application]

1. In the present application, the following embodiments may be described below by being divided into a plurality of sections for convenience, as needed, which are not independent from each other unless otherwise specified. One of the sections may be each part of a single example, the details of a part of the other, a modified example of a part or all of the other, or the like. In principle, parts having the same function will not be described repeatedly. Respective components of the embodiments are not essential unless otherwise specified, except when limiting the number of the components in theory, and except when considered not to be definitely so from the context thereof.

Further, the term "semiconductor device" or "semiconductor integrated circuit device" as used in the present application mainly includes a single unit of each of various transistors (active element), a device including a resistor, a capacitor, or the like integrated on a semiconductor chip or the like (for example, a monocrystalline silicon substrate), and the package centered on the single unit and including a semiconductor chip or the like. Here, various representative transistors can include a metal insulator semiconductor field effect transistor (MISFET), typified by a metal oxide semiconductor field effect transistor (MOSFET), by way of example. At this time, the representative integrated circuit structure can include a complementary metal insulator semiconductor (CMIS) type integrated circuit, typified by a complementary metal oxide semiconductor (CMOS) type integrated circuit that includes a combination of an N-channel MISFET and a P-channel MISFET by way of example.

Nowadays, a wafer process of the semiconductor integrated circuit device, that is, a large scale integration (LSI) is normally considered to be divided into two parts. That is, the first one is a front end of line (FEOL) step from carrying-in of a silicon wafer as a raw material up to before a premetal step (a process which involves formation of an interlayer insulating film or the like between a lower end of a M1 wiring layer and a gate electrode structure, formation of a contact hole and a tungsten plug, embedding, and the like). The second one is a back end of line (BEOL) step beginning from the premetal step up to a step of formation of a pad opening in a final passivation film over an aluminum-based pad electrode (in a wafer level package process, including the process). Note that strictly speaking, the boundary between these parts of the wafer process can be adjusted as needed.

In the present application, for convenience, a wiring and a via belonging to the same interlayer insulating film are named by being given the same name of the layer film while focusing on the layer of the interlayer insulating film. That is, a via arranged between a first embedded wiring layer and a second embedded wiring layer is a second layer via.

2. Likewise, in the description of the embodiments and the like, the term "X comprised of A" and the like regarding material, composition, etc., does not exclude the case of containing an element other than A as one of principal elements, unless otherwise specified and except when considered not to be definitely so from the context thereof. For example, regarding the element, the above expression means "X containing A as a principal element" or the like. Specifically, the term "silicon member" or the like is not limited to a member made of pure silicon, and can obviously include a member that contains a SiGe alloy, other multicomponent alloys containing another silicon as a principal component, other additives, and the like.

Similarly, the terms "silicon oxide film", "silicon oxide-based insulating film", and the like include not only an undoped silicon oxide (or undoped silicon dioxide) which is relatively pure, but also an insulating film containing other silicon oxides as a principal element. For example, the silicon oxide film is also a silicon oxide-based insulating film doped with impurities, such as a TEOS-based silicon oxide, a phosphorus silicate glass (PSG), or a borophosphosilicate glass (BPSG). In addition to a thermally-oxidized film and a CVD oxide film, a coating film, such as a spin on glass (SOG), or a nano-clustering silica (NSC), is also the silicon oxide film or silicon oxide-based insulating film. Moreover, a Low-k insulating film, such as a fluorosilicate glass (FSG), a silicon oxicarbide (SiOC), a carbon-doped silicon oxide, or an organosilicate glass (OSG) is also be the silicon oxide film or silicon oxide-based insulating film. Further, a silica-based Low-k insulating film that is obtained by introducing holes into the same member as described above (porous insulating film, in which the term "porous" as used herein includes a molecular porous material) is also the silicon oxide film or silicon oxide-based insulating film.

Silicon-based insulating films normally used in the field of semiconductors along with the silicon oxide-based insulating film include a silicon nitride-based insulating film. Materials belonging to this kind of based material include SiN, SiCN, SiNH, SiCNH, and the like. Here, the term "silicon nitride" as used herein includes both SiN and SiNH unless otherwise specified. Likewise, the term "SiCN" as used herein includes both SiCN and SiCNH unless otherwise specified.

SiC has the similar properties to those of SiN. SiON (SiOC, SiOCN) should be classified as a material for the silicon oxide-based insulating film in many cases. However, when used as material for an etch stop film or a reference-light reflection accelerating film, the SiON has properties close to SiC, SiN, and the like. Thus, these oxide and nitride (carbide, carbonitride) are classified depending on which element is the principal element.

The nitride silicon-based insulating film, such as a silicon nitride film, is widely used as the etch stop film in a self-aligned contact (SAC) technique, that is, as a contact etch-stop layer (CESL), and also used as a stress applying film in a stress memorization technique (SMT).

Likewise, the term "nickel silicide" as used herein normally indicates a nickel monosilicide, but can include not only the relatively pure one, but also an alloy, a mixed crystal, and the like containing nickel monosilicide as a principal element. Silicide is not limited to nickel silicide, and may be cobalt silicide, titanium silicide, tungsten silicide, and the like, which have a good trace record in the related art. Metal films used for silicidation can be, in addition to a Ni (nickel) film, a nickel alloy film, for example, a Ni—Pt alloy film (an alloy film of Ni and Pt), a Ni—V alloy film (an alloy film of Ni and V), a Ni—Pd alloy film (an alloy film of Ni and Pd), a Ni—Yb alloy film (an alloy film of Ni and Yb), or a Ni—Er alloy film (an alloy film of Ni and Er). Note that the silicides containing such nickel as the principal metal element are collectively called "nickel-based silicide".

3. The term "wafer" as used herein generally indicates a monocrystalline silicon wafer on which a semiconductor integrated circuit device (note that the same goes for a semiconductor device, and an electronic device) is formed, and can obviously include a composite wafer or the like of an insulating substrate such as an epitaxial wafer, a SOI substrate, or a LCD glass substrate, and a semiconductor layer etc.

The term "chip region" as used herein means a concept that a real shape does not become apparent, that is, also includes "a region to serve as a chip region". This is because the chip region does not appear yet at a wafer obtained immediately after introduction thereof.

4. It is obvious that preferable examples of graphics, positions, properties, and the like are exemplified below, but are not limiting strictly unless otherwise specified and except when considered not to be definitely so from the context. Therefore, for example, the term "square" as used herein includes a substantially square shape, the term "perpendicular" as used herein includes the case of being substantially perpendicular, and the term "identical" as used herein includes the case of being substantially identical. The same goes for the terms "parallel" and "at a right angle". Thus, for example, a deviation of approximately 10 degrees from the completely parallel state belongs to the concept of parallel.

The terms "entire", "overall", "whole", and the like of one region as used herein include "substantially entire", "substantially overall", and "substantially whole", and the like. Therefore, for example, the state of 80% or more of one region can be regarded as the "entire", "overall", and "whole" region. The same goes for the terms "entire peripheral", "whole-length", and the like.

Further, the term "rectangle" used herein to represent the shape of one member includes a "substantially rectangular shape". Therefore, for example, if an area of a part having a shape other than the rectangle is less than about 20% of the whole area, the whole shape can be regarded as the rectangle. In this case, the same goes for "a ring shape", or the like. Here, when a ring shaped member is divided into element parts, the divided elements are interpolated or extrapolated to become parts of the ring shaped member.

Regarding the periodicity, the term "periodical" as used herein includes the substantially periodical state. Each individual element with a periodicity displaced by, e.g., less than about 20% can be regarded as the "periodical" one. Further, if the ratio of elements displaced from this range to all elements of interest for the periodicity is, for example, less than about 20%, all the elements can be regarded as the "periodical" one as a whole.

Note that the definitions in this chapter are general. If the following individual description has a definition different from the general one, the different individual definition is prioritized over the general one herein. Note that the definition, stipulation, and the like in this chapter are still effectively applied to an individual part of the description that is not stipulated, as long as it is not clearly denied.

5. Further, also when referring to a specific numeral value or amount, a numerical value for a component in the invention may exceed the specific numerical value, or may be less than the specific numerical value, unless otherwise specified, and except when limited to the specific number in theory, or considered not to be definitely so from the context thereof.

6. In the present application, classification of ultraviolet rays will substantially comply with examples of semiconductor lithography. Therefore, the classification in the present application is different from a classification in terms of general spectroscopy. This is because a point of view of the classification in terms of the semiconductor lithography differs from that in terms of the general spectroscopy. The classification in the present application is slightly different even from the semiconductor lithography. Specifically, the present application will comply with the following classification. That is, the ultraviolet ray covers a region from an end of a short wavelength of a visible light to a soft-x ray region in terms of the general spectroscopy. The wavelength region is in a range of approximately 10 nm or more and less than 440 nm. In the wavelength region, the light with a wavelength in a range of 300 nm or more and less than 440 nm is called "near-ultraviolet ray", while the light with a wavelength in a range of 200 nm or more and less than 300 nm is called "far-ultraviolet ray". Further, the light with a wavelength in a range of 100 nm or more and less than 200 nm is called "vacuum-ultraviolet ray", while the light with a wavelength in a range of 10 nm or more and less than 100 nm is called "extreme-ultraviolet ray".

Irradiation with ultraviolet rays inevitably accompanied by the dry etching is not the "irradiation" defined in the present application. This is because radiation with ultraviolet rays from a plasma inevitably exists during dry-etching, which is often used for a semiconductor process (generally, in a band range from approximately 100 nm to 440 nm). The radiation with ultraviolet rays accompanied by the dry etching might damage a semiconductor or an interface thereof, and can cause noise etc., in an image sensor and the like. Therefore, the irradiation of wafers with the ultraviolet rays is not included in the meaning of the "irradiation with far-ultraviolet rays etc.," defined in the present application. Note that even in a plasma CVD or the like, radiation with ultraviolet rays from plasma inevitably exist, which is the same case as the dry etching. On the other hand, in some cases, the meaning of the "irradiation" described in the present application includes the irradiation of a wafer with ultraviolet rays which is not accompanied by the irradiation of the wafer with ultraviolet rays from the plasma, in a CVD and other deposition processes, a heat treatment, etching, a surface treatment, and the like, each of which is performed while irradiating the wafer with ultraviolet rays or the like.

The term "multi-layer wiring layer" as used in the present application sometimes means a layer configuring a bonding pad, that is, both the case of including all or a part of a pad layer and the case of not including the pad layer. In other words, the multi-layer wiring layer means one comprised of at least two or more wiring layers (except for the pad layer).

Further, the term "semiconductor substrate treatment step" as used in the present application substantially corresponds to the FEOL step, unless otherwise specified, or except when considered not to be so in principle, or from the context or the like. That is, the semiconductor substrate treatment step includes provision of a silicon wafer or the like, formation of an impurity doped region (photodiode), formation of gate structures of N-type and P-type MISFETs forming a pixel region and a control circuit, formation of an antireflection film (in the case of the surface-irradiation type etc.), and the like. It is apparent that parts of these elements may be formed in a step other than the semiconductor substrate treatment step, or that the adjustment of the structure, properties, and the like of parts of these elements is not excluded.

In the present application, regardless of a final device form, a main surface of a semiconductor substrate 1s (see FIG. 5) with gate structures of the N-type and P-type MISFETs or the like formed thereover is called "a surface", while the other main surface opposite to the above-mentioned surface is called "a backside" in the semiconductor substrate treatment step. This is because there are surface-irradiation type and backside-irradiation type image sensors that are mounted chips, and if they are distinguished based on the direction of the final form, this complicates a distinction between both types. Thus, upon completion of the device on the chip with the backside-irradiation type image sensor mounted thereof, the surface of the chip on which a color filter, a microlens, or the like is formed is the backside.

Details of Embodiments

The embodiments of the invention will be further described in detail below. In each drawing, the same or like parts are indicated by the same or similar reference character or number, and its description will not be repeated in principle.

In the accompanying drawings, even a cross-sectional view may omit hatching and the like in some cases if the hatching possibly makes the sectional view complicated, or when a void is easy to discriminate. In this context, the outline of a hole closed in a planar manner with respect to the background may be omitted when clearly seen from the description or the like. Further, in order to represent a part which is not the void, the hatching is sometimes given even when the figure is not a cross-sectional view.

As to naming upon a choice between the two, one is called "the first" or the like, and the other is called "the second" or the like. In this case, although the naming is given while being associated with each of the representative embodiments, it is obvious that, for example, even the term "the first" is not necessarily limited to the choice exemplified.

1. Explanation of one example of the circuit configuration etc., of a CMOS chip with a CMOS image sensor obtained by a manufacturing method of a semiconductor integrated circuit device according to one embodiment of the present application (see mainly FIGS. 1 to 3)

In this section, a specific description will be given of a typical structure corresponding to a semiconductor integrated circuit chip etc., for a digital camera (including one mounted on a mobile phone etc.) equipped with the CMOS image sensor, by way of example. It is apparent that the following example can be applied not only to digital cameras, but also to general semiconductor integrated circuit devices that process optical image information.

The contents described in this section serve as the basis for contents that will be described in the following all other sections. In the section 2 or later, the repeated description will be avoided in principle.

Here, for the sake of ease, a four-transistor pixel will be specifically described by way of example. However, the pixel configuration may have any other structure, or a plural pixel-sharing system.

Here, a photodiode array region is the arrangement of pixels in a matrix by way of example, which will be specifically described below. For example, the pixels may be arranged by being displaced by a half pitch every row or the like.

Further, in the following, the semiconductor integrated circuit device having an X-Y address type photodiode array region will be specifically described by way of example. However, it is obvious that any other reading system may be applied.

Figure 2:
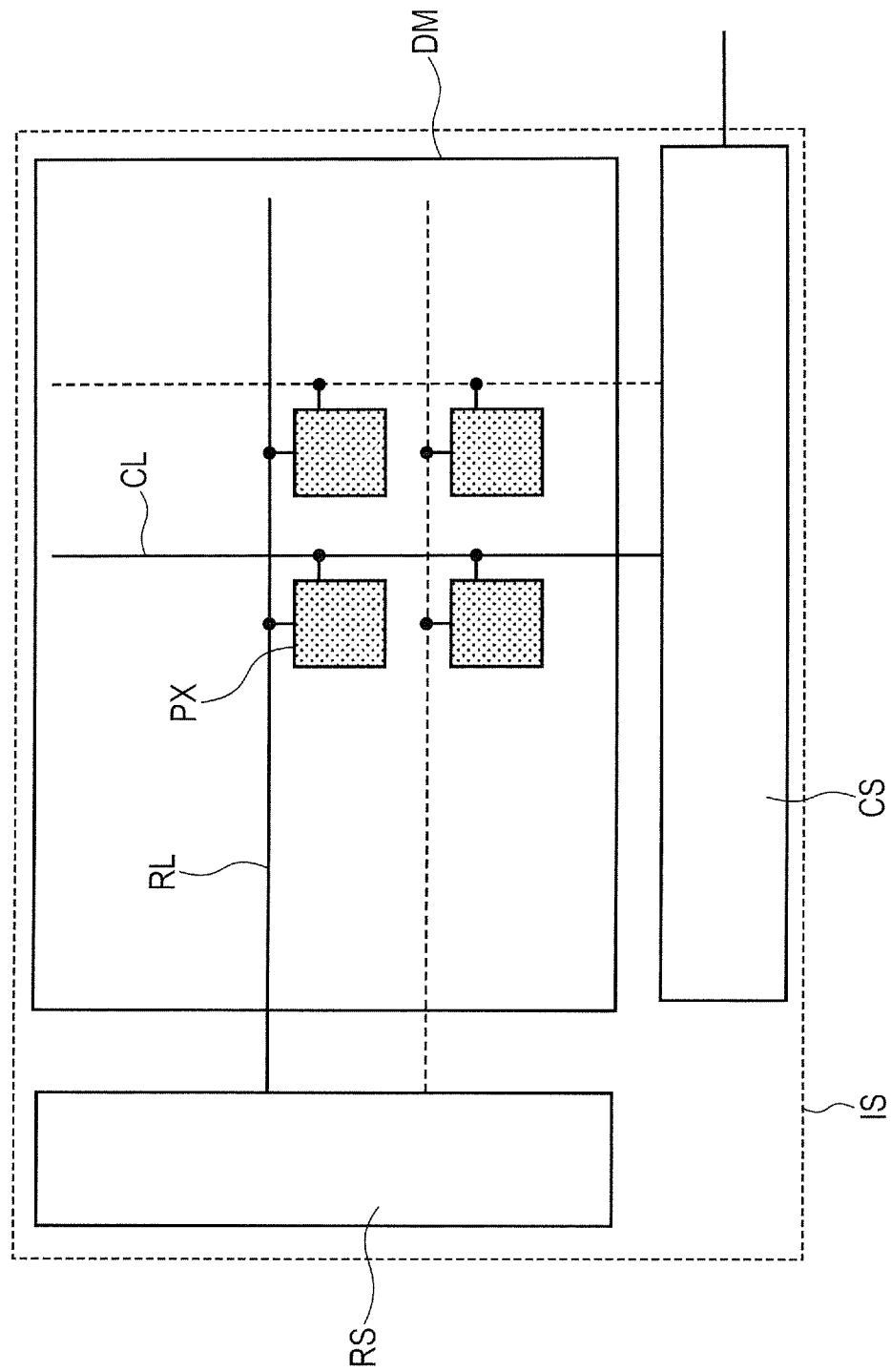
FIG. 2 is an entire circuit configuration diagram showing an example of a CMOS image sensor region IS shown in FIG. 1.
Figure 3:
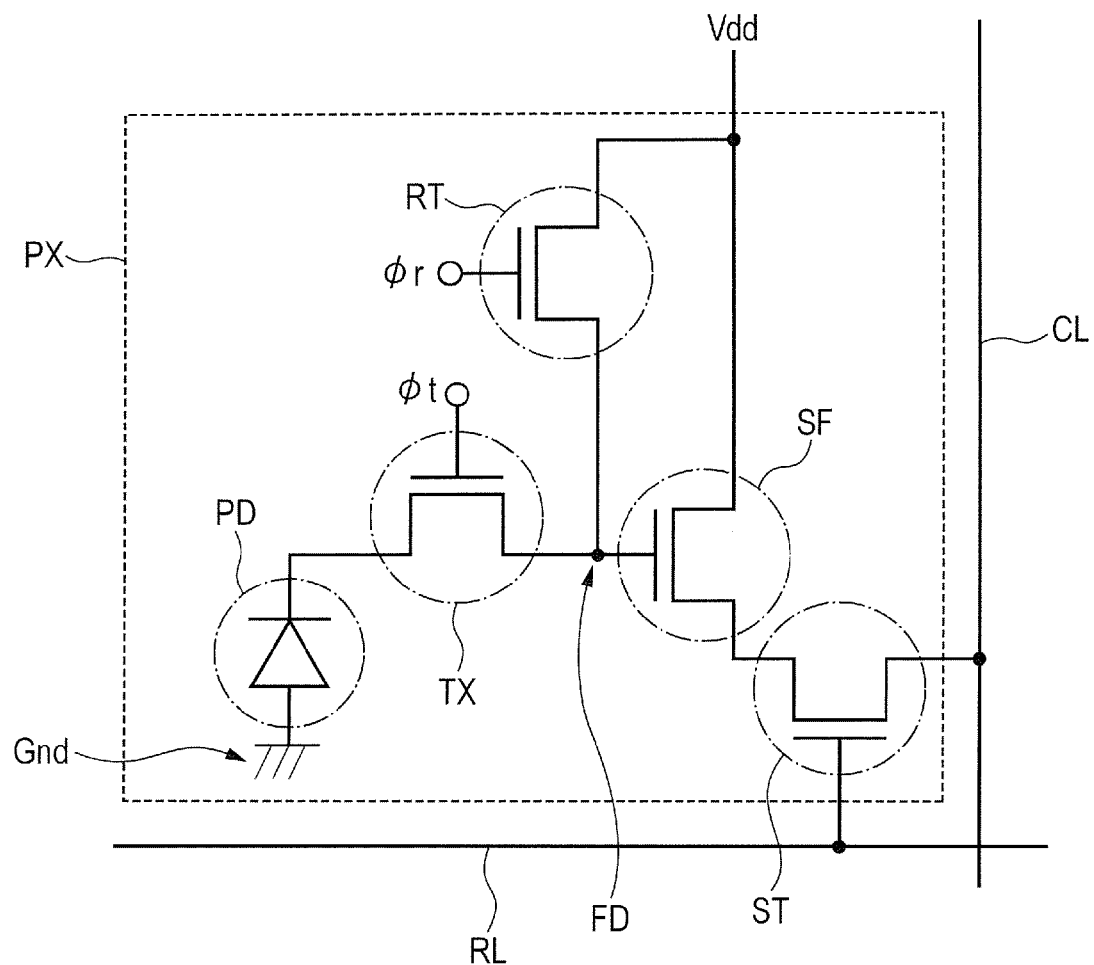
FIG. 3 is an entire circuit diagram showing an example of a pixel region PX shown in FIG. 2.

FIG. 1 is a circuit configuration diagram of an upper surface of an entire chip for explaining an example of a circuit configuration or the like of a CMOS chip including a CMOS image sensor obtained by a manufacturing method of a semiconductor integrated circuit device according to one embodiment of the present application. FIG. 2 is an entire circuit configuration diagram showing an example of a CMOS image sensor region IS shown in FIG. 1. FIG. 3 is an entire circuit diagram showing an example of a pixel region PX shown in FIG. 2. Referring to these figures, a description will be given of one example of the circuit configuration or the like of the CMOS chip with the CMOS image sensor obtained by the manufacturing method of the semiconductor integrated circuit device in the one embodiment of the present application.

FIG. 1 illustrates one example of the circuit configuration on the CMOS chip. As shown in FIG. 1, a CMOS image sensor IS (CMOS image sensor region, CMOS image sensor circuit unit) is provided over a first main surface 1a of a chip 2 (a device surface, that is, a surface opposite to a second main surface 1b). The CMOS image sensor IS includes a photodiode array region DM and a peripheral circuit region PC. An output signal from the CMOS image sensor circuit IS is converted to a digital signal, for example, by an AD conversion circuit region ADC (AD conversion circuit unit). The digital signal is fed to, for example, a digital signal processing circuit region DSP (digital signal processing circuit unit), and if necessary output to the outside. Note that these circuits are controlled, for example, by a control circuit region CC (control circuit unit).

Next, one example of the circuit configuration of the CMOS image sensor region IS shown in FIG. 1 is illustrated in FIG. 2. As shown in FIG. 2, the photodiode array region DM in which pixel regions PX (pixels) are arranged in a matrix is provided in the CMOS image sensor region IS. The numerous pixel regions PX are electrically coupled to a corresponding row selection line RL every row. The numerous row selection lines RL are controlled by a row selection circuit region RS (row selection circuit unit). Likewise, the numerous pixel regions PX are electrically coupled to a corresponding reading line CL every column. The numerous reading lines CL are electrically coupled to a reading circuit region CS (reading circuit unit).

Next, one example of the circuit configuration of the pixel region PX shown in FIG. 2 is illustrated in FIG. 3. As shown in FIG. 3, a photodiode PD whose anode is coupled to the ground potential is provided within the pixel region PX. A cathode of the photodiode is electrically coupled to a floating diffusion layer FD (floating diffusion layer node) via a transfer transistor TX. The transfer transistor TX is controlled to be turned On and Off by a transfer signal $\Phi t$. The floating diffusion layer FD is electrically coupled to a power source Vdd (power supply potential) via a reset transistor RT, and is controlled by a reset signal $\Phi r$. Signal charges (signal potential) transferred to the floating diffusion layer FD are amplified by an amplification transistor SF, and are electrically coupled to the reading lines CL via a row selection transistor ST.

2. Explanation of one example of a device structure or the like of the pixel region in the CMOS image sensor obtained by the manufacturing method of the semiconductor integrated circuit device according to the above-mentioned one embodiment of the present application (see mainly FIGS. 4 and 5)

In this section, a specific description will be given of the structure or the like of the pixel region by taking the circuit configuration or the like described in the section 1 as an example.

The contents described in this section serve as the basis for contents that will be described in the following all other sections. In the section 3 or later, the repeated description will be avoided in principle.

Note that a charge transfer pixel will be specifically described as an example. However, it is obvious that other types of pixels may be applied.

Here, pixels included in an embedded photodiode (Pinned Photo Diode) will be specifically described as an example. Alternatively, it is also obvious that other types of pixels may be used.

Although a description will be specifically given of a substrate and a structure of an impurity region using an N-type substrate by way of example, it is apparent that those using a P-type substrate may be used. Likewise, here, a deep P well formed in the N-type substrate will be specifically described as an example. However, it is obvious that the substrate provided with a P-type epitaxial region or without the deep P well may also be used.

In the following, a structure equipped with an on-chip microlens and a color filter will be specifically described as an example. A structure without using all or apart of them may also be used. Obviously, a structure equipped with an inner lens may be used.

Figure 4:
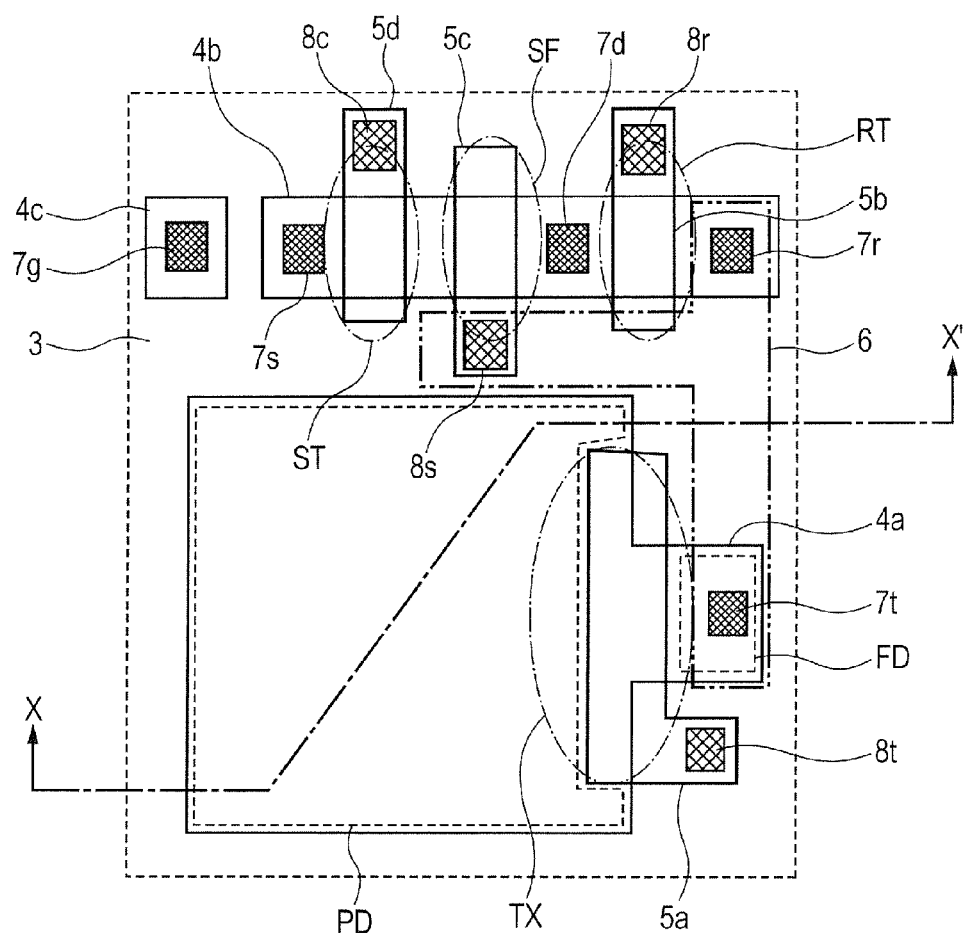
FIG. 4 is a layout diagram showing an example of a device layout corresponding to FIG. 3 for explaining one example of a device structure and the like in the pixel region of the CMOS image sensor obtained by the manufacturing method of the semiconductor integrated circuit device in the one embodiment of the present application.
Figure 5:
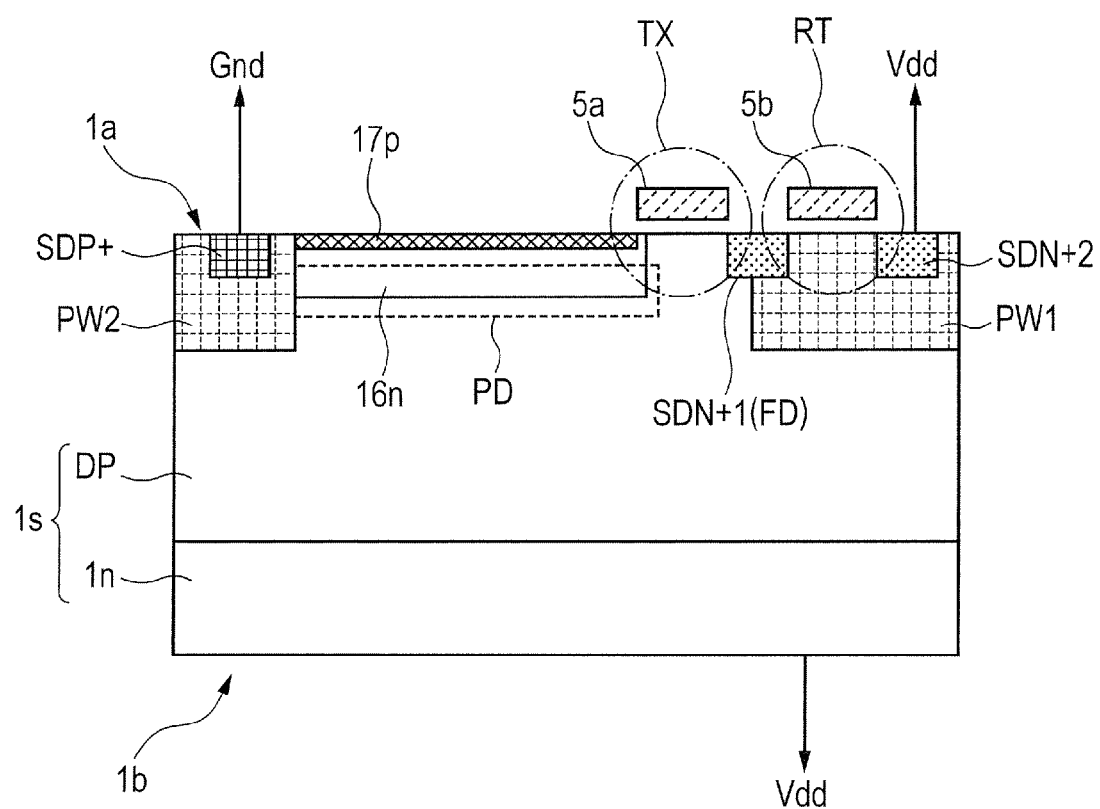
FIG. 5 is an explanatory diagram of a device cross-section structure substantially corresponding to the layout shown in FIG. 4 (for better understanding, parts of connection structures or the like are omitted)

FIG. 4 is a layout diagram showing an example of a device layout corresponding to FIG. 3 for explaining one example of the device structure and the like in the pixel region of the CMOS image sensor obtained by the manufacturing method of the semiconductor integrated circuit device in the one embodiment of the present application. FIG. 5 is an explanatory diagram of a cross-section device structure substantially corresponding to the layout shown in FIG. 4 (for better understanding, parts of connection structures or the like are omitted). Referring to these figures, a description will be given of one example of the device structure or the like of the pixel region in the CMOS image sensor obtained by the manufacturing method of the semiconductor integrated circuit device in the one embodiment of the present application.

FIG. 4 illustrates one example of a planar layout of the pixel region PX shown in FIG. 3. As shown in FIG. 4, in this example, a plurality of active regions 4a, 4b, and 4c are provided within the pixel region PX, and are isolated from each other by a STI region 3 (element isolation region).

In the active region 4a, the photodiode PD and the transfer transistor TX are provided. In the active region 4b, the reset transistor RT, the amplification transistor SF, and the row selection transistor ST are provided. On the other hand, in the active region 4c, a grounding contact 7g is provided. Here, the planar shape of the photodiode PD is shown to be substantially rectangular, but is not limited to the rectangle shape. Alternatively, the planar shape of the photodiode PD may be a circular shape, or a polygonal shape of a pentagonal shape or more.

A gate electrode 5a of the transfer transistor TX is formed in the vicinity of the right end of the active region 4a. The transfer signal Φt (see FIG. 3) is fed to the gate electrode via a via 8t with the metal wiring.

A contact 7t between the floating diffusion layer FD and the metal wiring is formed at the right end of the active region 4a. For example, the contact 7t is coupled to the reset transistor RT via a contact 7r between an interconnecting wiring 6 (a first copper embedded wiring layer) and the metal wiring. The interconnecting wiring 6 is coupled to a gate electrode 5c of the amplification transistor SF via a via 8s with the metal wiring. A power source contact 7d is provided in the active region 4b between the gate electrode 5c and a gate electrode 5b of the reset transistor RT.

A gate electrode 5d of a row selection transistor ST is provide in the active region 4b between a contact 7s with the reading line CL (see FIG. 3) of the row selection transistor ST and the gate electrode 5c of the amplification transistor SF. The gate electrode 5d is electrically coupled to the row selection line RL (see FIG. 3) via the via 8c with the row selection line.

Next, an exemplary cross-section structure of the pixel region PX is illustrated in FIG. 5 for better understanding of the principle of operation in relation to FIG. 3. This figure has a part not corresponding to FIG. 4 for simplification. For example, the floating diffusion layer FD is typified by a single impurity region. As shown in FIG. 5, in this example, P-type well regions PW1 and PW2 having a higher concentration than that of a P-type deep well region DP are provided in a surface region on a side of a first main surface 1a of a semiconductor substrate 1s. High-concentration N-type regions SDN+1 and SDN+2 are provided corresponding to source and drain regions of the reset transistor RT or transfer transistor TX at the surface of the P-type well region PW1. The high-concentration N-type region SDN+2 is electrically coupled to the power supply potential Vdd as a reference potential for reset. The high-concentration N-type region SDN+1 is the floating diffusion layer FD. The gate electrode 5b of the reset transistor RT is provided over the first main surface 1a of the semiconductor substrate 1s between the high-concentration N-type region SDN+1 and the high-concentration N-type region SDN+2 via a gate insulating film or the like.

On the other hand, a high-concentration P-type region SDP+ is provided at the surface of a P-type well region PW2 so as to supply the ground potential Gnd. An N-type cathode region 16n of the photodiode PD is provided in contact with the P-type well region PW2 as the boundary therebetween in the surface region on the first main surface 1a side of the semiconductor substrate 1s. In this example, the N-type cathode region 16n forms a PN junction with the P-type deep well region DP. A surface P+type region 17p is formed over the surface of the N-type cathode region 16n so as to be electrically coupled to the P-type well region PW2, thereby relieving the influence on the photodiode PD from the surface of the N-type cathode region.

The gate electrode 5a of the transfer transistor TX is provided over the first main surface 1a of the semiconductor substrate is between the high-concentration N-type region SDN+1 and the N-type cathode region 16n via the gate insulating film or the like.

In operation, an N-type substrate region in is electrically coupled to the power supply potential Vdd, and the P-type deep well region DP, the P-type well regions PW1 and PW2, and the surface P+type region 17p are electrically coupled to the ground potential Gnd. Therefore, the PN junction formed in the photodiode PD is reverse-biased.

3. Detailed explanation of the device structure of the like in the pixel region and a pad formation region of the CMOS image sensor (of the surface-irradiation type) obtained by the manufacturing method of the semiconductor integrated circuit device according to the one embodiment of the present application (see mainly FIGS. 6 and 7)

In this section, one example of the device structure completely manufactured will be described as a precondition below, before the description of manufacturing processes in the manufacturing method of the semiconductor integrated circuit device in the one embodiment of the present application. In an image sensor mounting chip, such as a CMOS image sensor mounting chip, a photodiode array region DM etc. (see FIG. 1), and a non-photodiode array region including the control circuit region CC etc. (see FIG. 1) partially differ from each other in cross-section structure. In the following, a pad formation region 9 (see FIG. 1) will be described as one example of the non-photodiode array region.

Note that the actual laminated structure of the semiconductor device is very complicated. In the description below (figures of interest), only main films are shown while illustration of some films is omitted.

Figure 6:
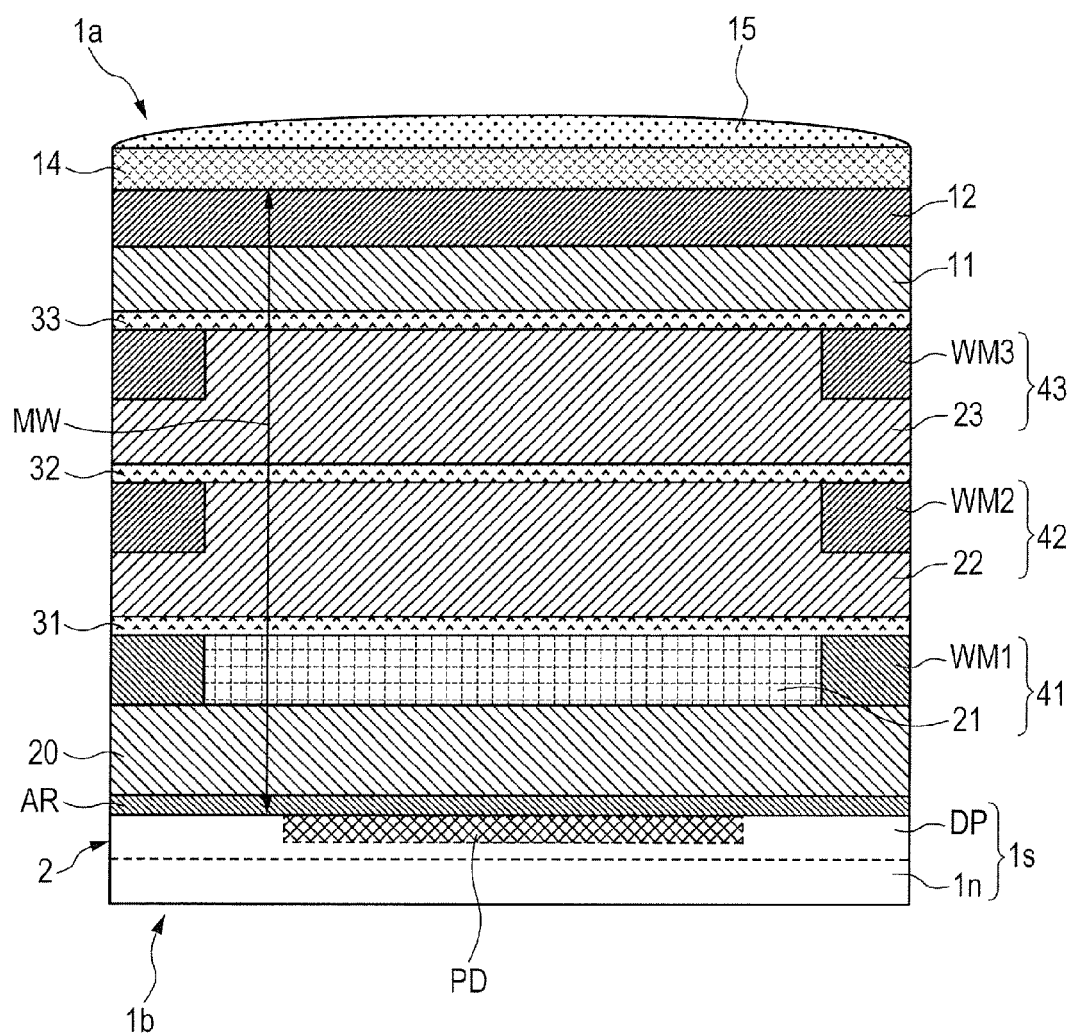
FIG. 6 is a device cross-sectional view taken along the line X-X' of FIG. 4 for explaining the details of the device structure or the like in the pixel region PX (see FIGS. 2 and 3) of the CMOS image sensor (of a surface-irradiation type) obtained by the manufacturing method of the semiconductor integrated circuit device in the one embodiment of the present application.
Figure 7:
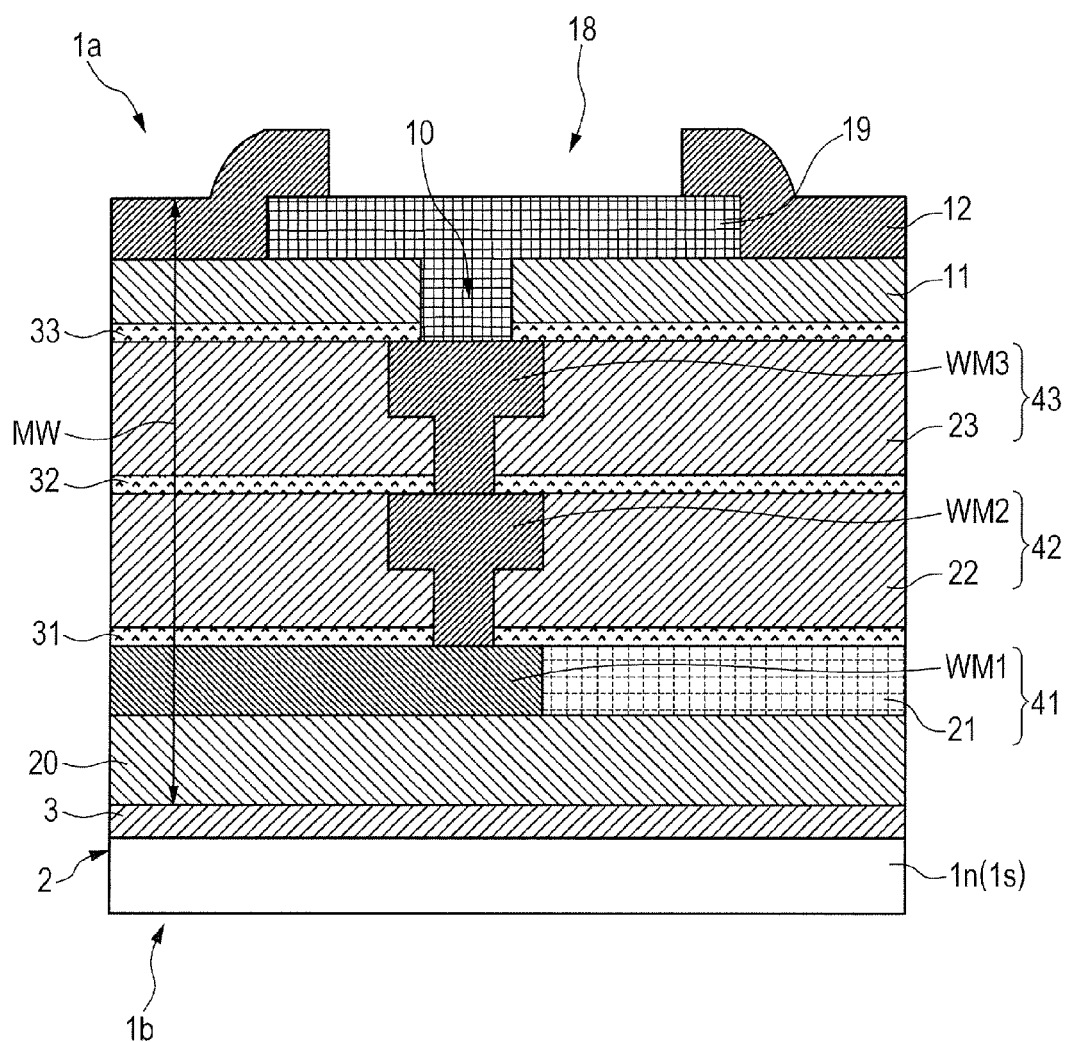
FIG. 7 is a device cross-sectional view for explaining the details of the device structure or the like in a pad formation region 9 (see FIG. 1) of the CMOS image sensor (of the surface-irradiation type) obtained by the manufacturing method of the semiconductor integrated circuit device in the one embodiment of the present application.

FIG. 6 is a device cross-sectional view taken along the line X-X' of FIG. 4 for explaining the details of the device structure or the like in the pixel region PX (see FIGS. 2 and 3) of the CMOS image sensor (of a surface-irradiation type) obtained by the manufacturing method of the semiconductor integrated circuit device in the one embodiment of the present application. FIG. 7 is a device cross-sectional view for explaining the details of the device structure or the like of the pad formation region 9 (see FIG. 1) of the CMOS image sensor (of the surface-irradiation type) obtained by the manufacturing method of the semiconductor integrated circuit device in the one embodiment of the present application. Referring to these figures, a detailed description will be given of the device structure or the like in the pixel region and the pad formation region of the CMOS image sensor (of the surface-irradiation type) obtained by the manufacturing method of the semiconductor integrated circuit device in the one embodiment of the present application.

The section of the semiconductor chip 2 is shown in FIG. 6 (pixel region PX) and FIG. 7 (pad formation region 9). As shown in FIGS. 6 and 7, for example, a main portion of the semiconductor substrate is (e.g., N-type monocrystalline silicon substrate) is comprised of, for example, the N-type monocrystalline silicon substrate region in (N-type substrate region).

In the pixel region PX, for example, the P-type deep well region DP is provided in the surface 1a (first main surface) of the semiconductor substrate 1s, that is, in the main surface opposite to the backside 1s (second main surface). The photodiode PD is provided in the vicinity of the surface of the P-type deep well region DP. Further, for example, an antireflection film AR is provided over the surface of the P-type deep well region DP. Suitable antireflection films AR can include, for example, a laminated film comprised of a silicon nitride film and a silicon oxide film.

On the other hand, in the pad formation region 9, a field insulating film is provided over the surface 1a of the semiconductor substrate 1s. The field insulating film includes a silicon oxide film or the like that forms an element isolation region 3, such as a shallow trench isolation (STI) region, as a main component.

A premetal insulating film 20 is provided over the antireflection film AR in the pixel region PX, and over the field insulating film 3 in the pad formation region 9. The premetal insulating film 20 includes, for example, a silicon oxide-based insulating film, such as a silicon oxide film, as a main component. A first-wiring-layer main insulating film 21 is formed over the premetal insulating film 20. The first-wiring-layer main insulating film 21 includes, for example, a silicon oxide-based insulating film, such as a silicon oxide film, as a main component. A first metal wiring layer WM1 made of e.g., a copper-based single damascene wiring, is embedded in the first-wiring-layer main insulating film 21. In this way, a first wiring layer 41 includes the first-wiring-layer main insulating film 21, and the first metal wiring layer WM1.

An insulating barrier film 31 over the first metal wiring layer is formed over the first wiring layer 41, and includes a silicon nitride-based barrier insulating film and the like, such as a SiCN film. A second-wiring-layer main insulating film 22 is formed over the insulating barrier film 31 over the first metal wiring layer. The second-wiring-layer main insulating film 22 includes, for example, a silicon oxide-based insulating film, such as a silicon oxide film, as a main component. A second metal wiring layer WM2 made of e.g., a copper-based dual damascene wiring, is embedded in the second-wiring-layer main insulating film 22. In this way, a second wiring layer 42 is comprised of the second-wiring-layer main insulating film 22, and the second metal wiring layer WM2.

An insulating barrier film 32 over the second metal wiring layer is formed over the second wiring layer 42, and includes, for example, a silicon nitride-based barrier insulating film and the like, such as a SiCN film. A third-wiring-layer main insulating film 23 is formed over the insulating barrier film 32 over the second metal wiring layer, and includes a silicon oxide-based insulating film, such as a silicon oxide film, as a main component. A third metal wiring layer WM3 made of e.g., a copper-based dual damascene wiring, is embedded in the third-wiring-layer main insulating film 23. In this way, a third wiring layer 43 is comprised of the third-wiring-layer main insulating film 23, and the third metal wiring layer WM3. Here, in the pixel region PX, the third metal wiring layer WM3 may also be used, for example, as a light shielding film.

An insulating barrier film 33 over the third metal wiring layer is formed over the third wiring layer 43, and includes, for example, a silicon nitride-based barrier insulating film and the like, such as a SiCN film. An insulating film 11 under a pad layer is formed over the insulating barrier film 33 over the third metal wiring layer. The insulating film 11 under the pad layer includes, for example, a silicon oxide-based insulating film, such as a silicon oxide film, as a main component.

In the pad formation region 9, for example, a pad layer via hole 10 is formed in the insulating barrier film 33 over the third metal wiring layer and the insulating film 11 under the pad layer. A bonding pad 19 (pad layer metal wiring) is provided over the insulating film 11 under the pad layer, and within the pad layer via hole 10. The bonding pad 19 can preferably include, for example, a multi-layer metal film comprised of a lower-layer titanium nitride film, an aluminum-based wiring film as a main portion of an intermediate layer, and an upper-layer titanium nitride film or the like.

A passivation film 12 over the pad layer is formed over the insulating film 11 under the pad layer within the pad formation region 9, over the bonding pad 19 except for a pad opening 18, and over the insulating film 11 under the pad layer within the pixel region PX. The passivation film 12 over the pad layer can preferably include, for example, a multi-layer insulating film comprised of a lower-layer silicon oxide-based insulating film made of a relatively thin silicon oxide film etc., and an upper-layer silicon nitride-based insulating film made of a relatively thick silicon nitride film etc. In this example, a multi-layer wiring layer MW covers an area from the premetal insulating film 20 to the passivation film 12 over the pad layer, for example. In the pad opening 18, the titanium nitride film forming the upper layer of the bonding pad 19 is normally removed.

For example, a color filter layer 14 is provided over the passivation film 12 over the pad layer within the pixel region PX, and for example, a microlens layer 15 is provided thereover. These color filter layer 14 and microlens layer 15 are normally provided across the entire photodiode array region DM (see FIG. 1).

An inner lens layer made of, for example, a silicon nitride film or the like may be inserted into between the passivation film 12 over the pad layer and the color filter layer 14. In this case, a planarizing film made of, for example, polyimide resin etc., is normally applied over the inner lens layer to planarize its surface. Alternatively, the inner lens layer may be formed of the silicon nitride film forming the passivation film 12 over the pad layer.

The pad layer metal wiring is an aluminum-based non-embedded wiring, or alternatively may be, for example, a copper-based embedded wiring.

4. Explanation of a process flow or the like in a main manufacturing procedure of the COS image sensor (of the surface-irradiation type) obtained by the manufacturing method of the semiconductor integrated circuit device according to one embodiment of the present application (see mainly FIGS. 8 to 17)

In this section, the main processes of the manufacturing method of the semiconductor integrated circuit device according to the one embodiment of the present application will be described by taking the device structure described in the sections 1 to 3 as the example. It goes without saying that the device structure is not limited to this structure, and may have any other structure. It is obvious that the following processes are one of examples, and the order of steps, the timing of one processing, and the specific processing method and the like can be modified as needed.

The contents described in this section can be applied to other manufacturing methods as they are or almost as they are, and thus the same parts will not be repeatedly described in principle.

In the description of the process below, the pixel region PX will be mainly described (see FIGS. 2, 10, 11, 13, and 17) together with the description of the pad formation region 9 (see FIGS. 1, 12, and 14), particularly when needed.

Figure 8:
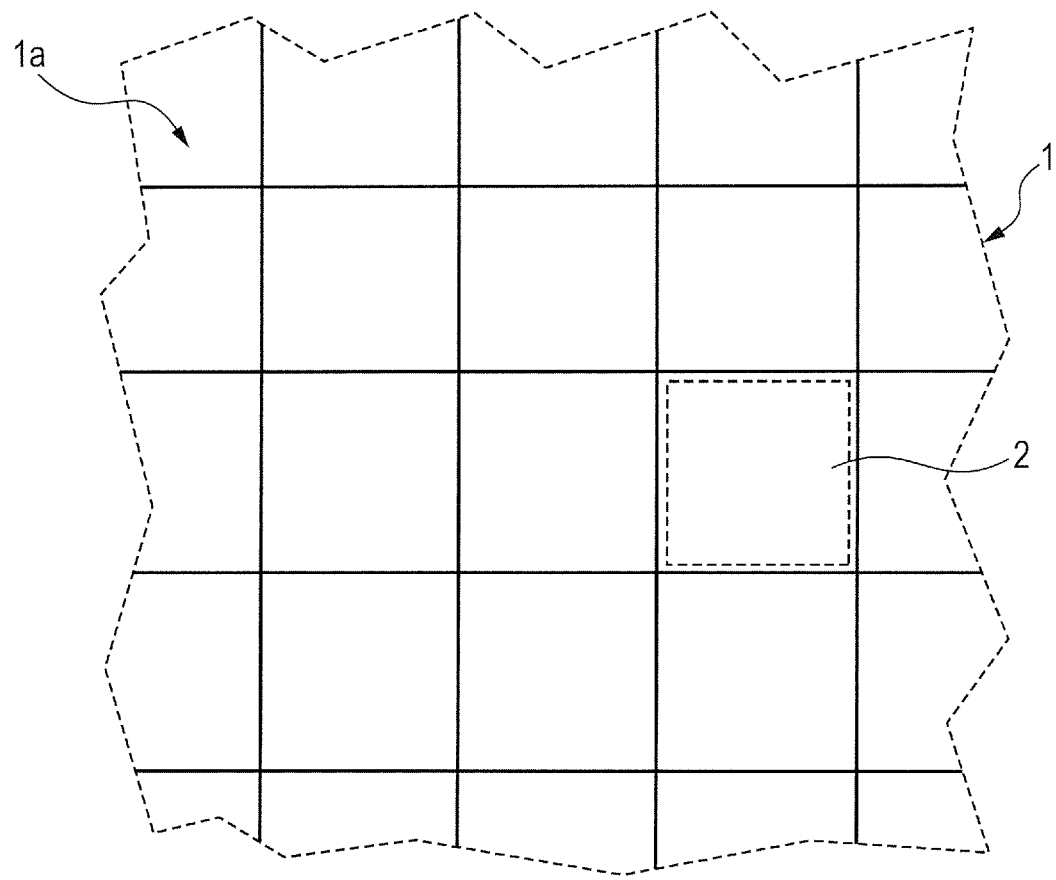
FIG. 8 is a partial layout diagram of an upper surface of a semiconductor wafer showing the arrangement of chip regions at a wafer surface, for explaining a process flow or the like in a main manufacturing procedure for the CMOS image sensor (of the surface-irradiation type) obtained by the manufacturing method of the semiconductor integrated circuit device in the one embodiment of the present application.
Figure 9:
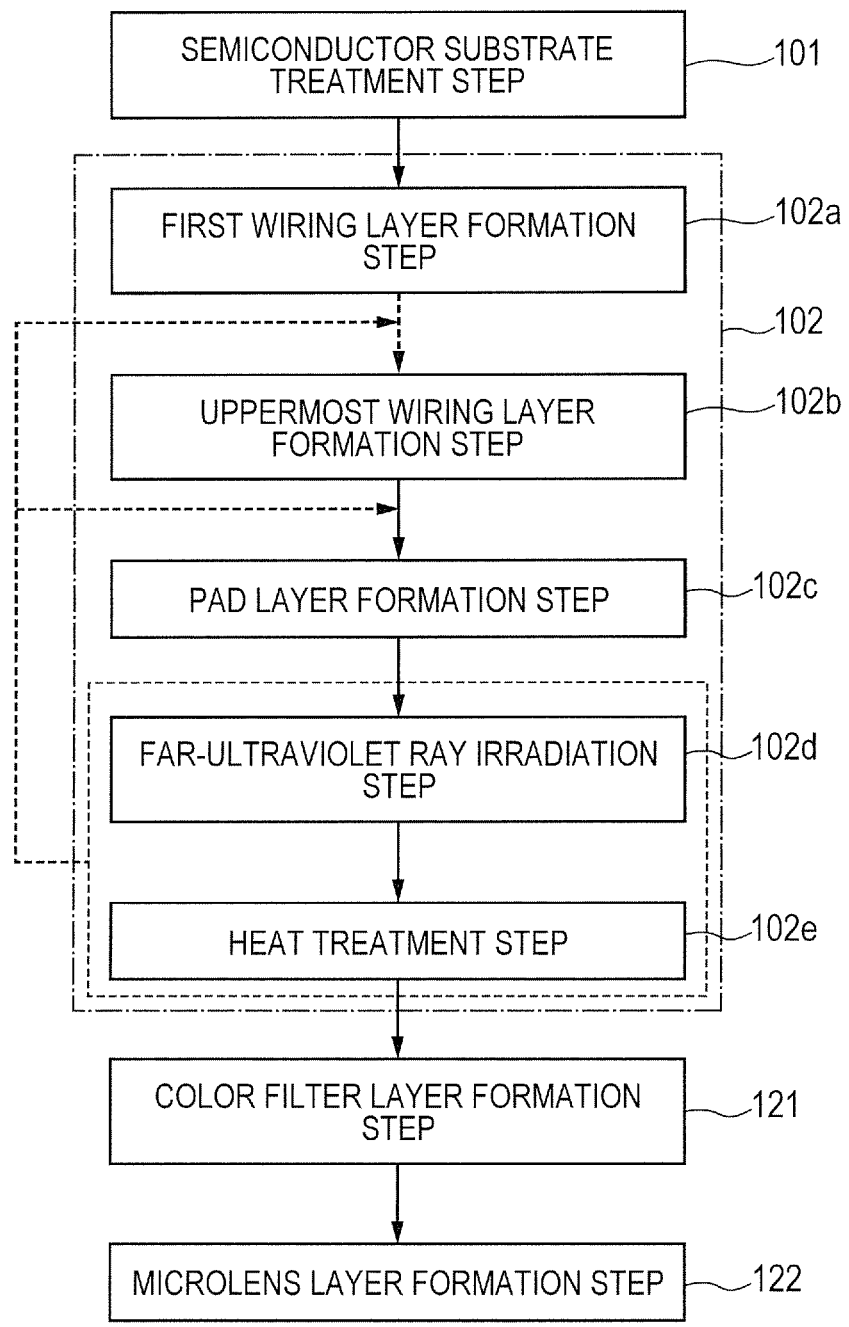
FIG. 9 is a main process block flowchart for explaining the process flow or the like in the main manufacturing procedure for the CMOS image sensor (of the surface-irradiation type) obtained by the manufacturing method of the semiconductor integrated circuit device in the one embodiment of the present application.
Figure 10:
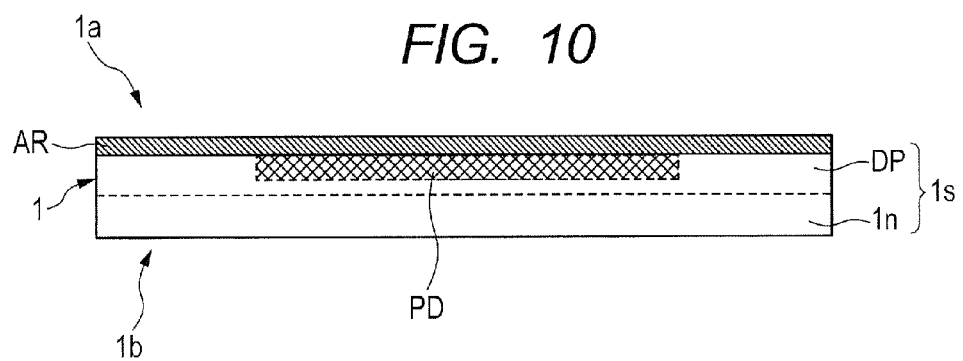
FIG. 10 is a device cross-sectional view of parts corresponding to FIG. 6 for explaining a process flow or the like in the pixel region PX in a manufacturing step (semiconductor substrate treatment step) of the CMOS image sensor (of the surface-irradiation type) in the manufacturing method of the semiconductor integrated circuit device in the one embodiment of the present application.
Figure 11:
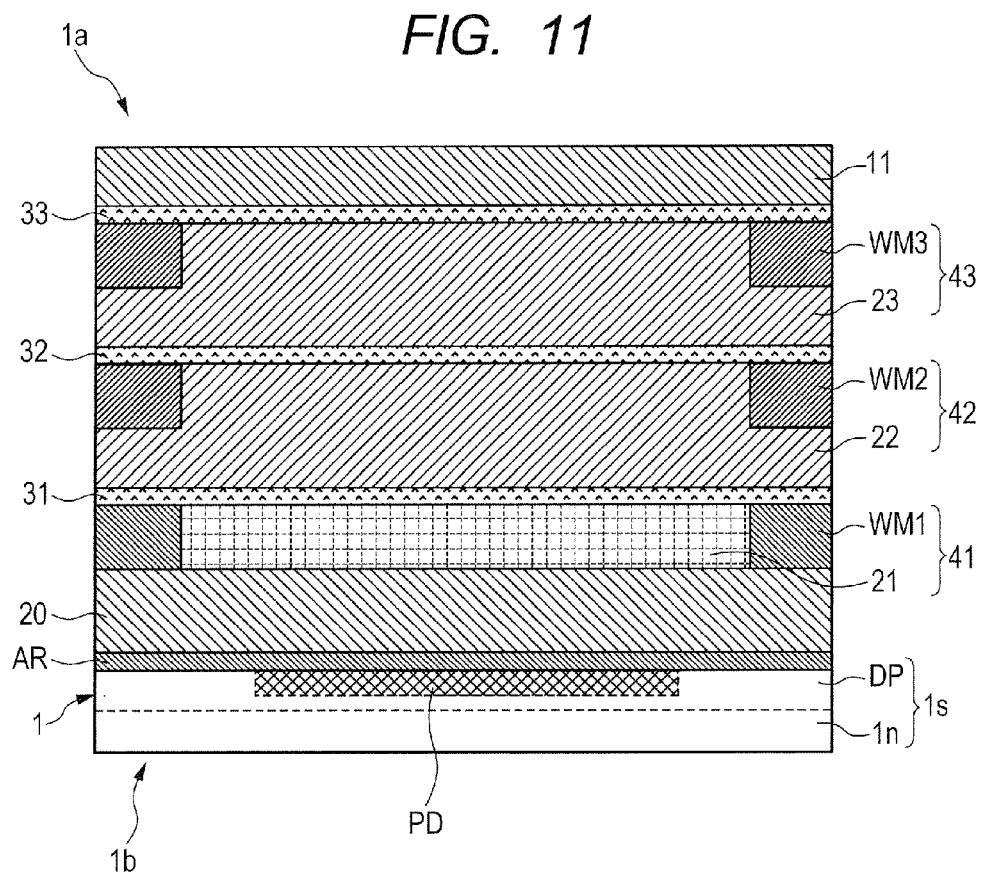
FIG. 11 is a device cross-sectional view of parts corresponding to FIG. 6 for explaining a process flow or the like in the pixel region PX in a manufacturing step (multi-layer wiring formation step) of the CMOS image sensor (of the surface-irradiation type) in the manufacturing method of the semiconductor integrated circuit device in the one embodiment of the present application.
Figure 12:
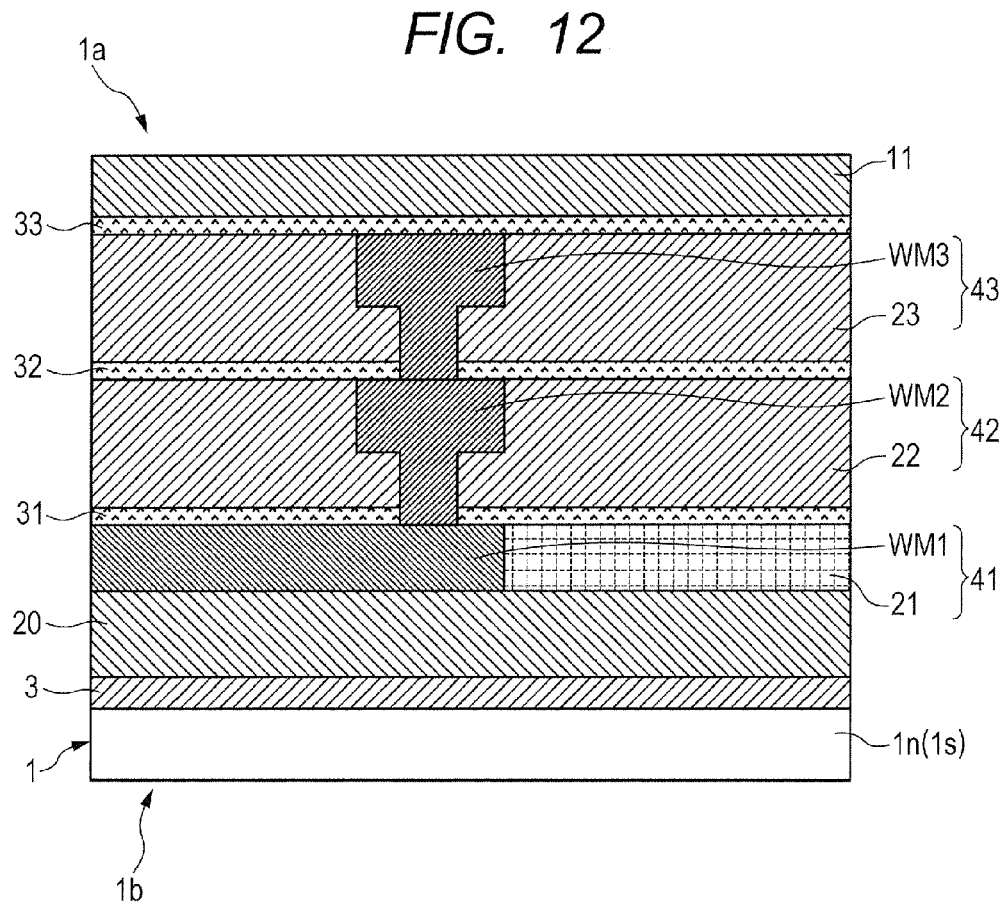
FIG. 12 is a device cross-sectional view of parts corresponding to FIG. 7 for explaining a process flow or the like in the pad formation region 9 in a manufacturing step (multi-layer wiring formation step) of the CMOS image sensor (of the surface-irradiation type) in the manufacturing method of the semiconductor integrated circuit device in the one embodiment of the present application.
Figure 13:
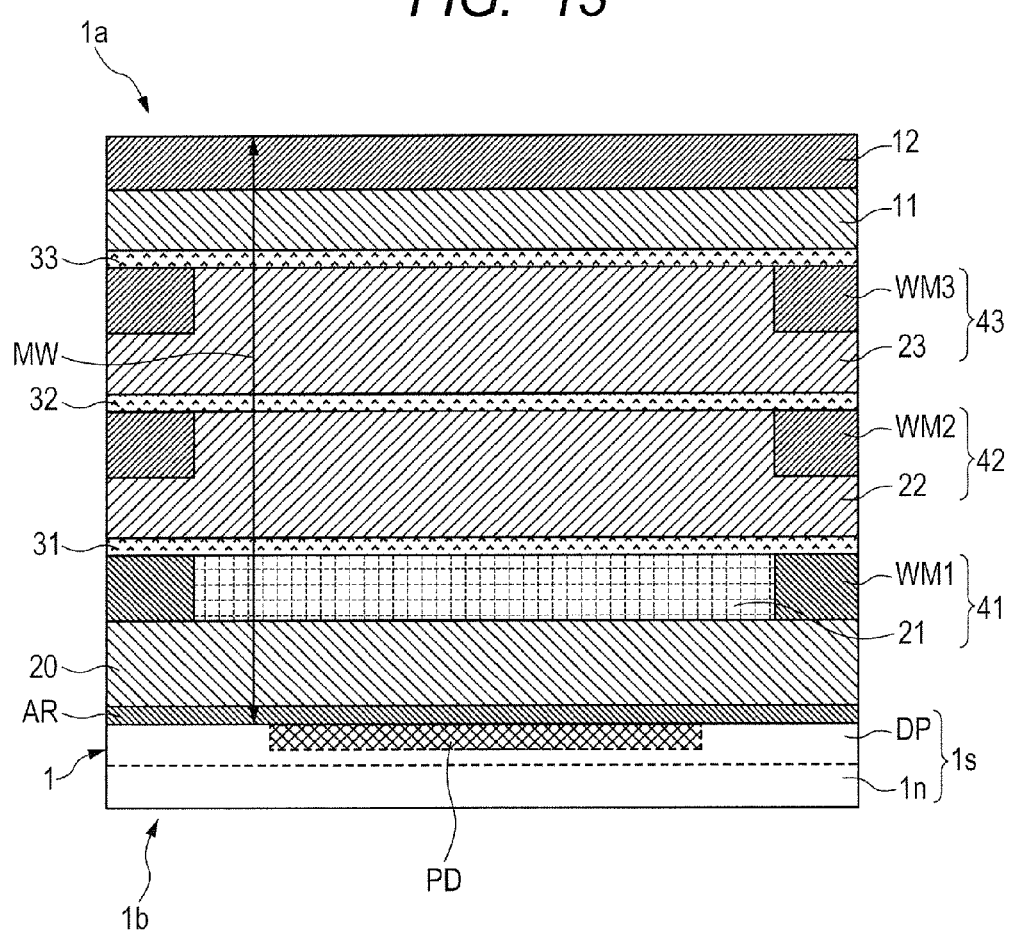
FIG. 13 is a device cross-sectional view of parts corresponding to FIG. 6 for explaining a process flow or the like in the pixel region PX in a manufacturing step (formation step of a passivation film over a pad layer) of the CMOS image sensor (of the surface-irradiation type) in the manufacturing method of the semiconductor integrated circuit device in the one embodiment of the present application.
Figure 14:
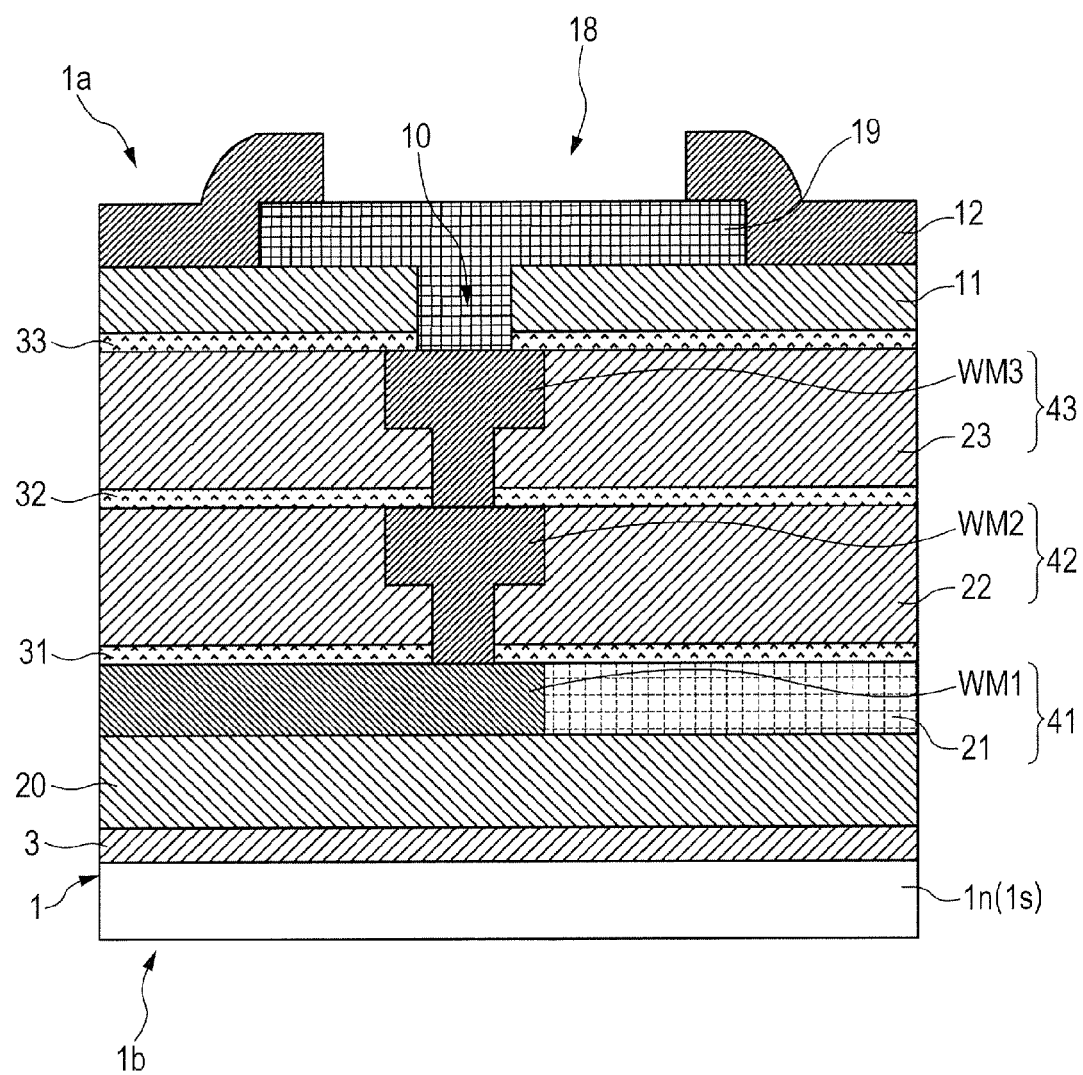
FIG. 14 is a device cross-sectional view of parts corresponding to FIG. 7 for explaining a process flow or the like in the pad formation region 9 in the manufacturing step (formation step of the passivation film over the pad layer) of the CMOS image sensor (of the surface-irradiation type) in the manufacturing method of the semiconductor integrated circuit device in the one embodiment of the present application.
Figure 15:
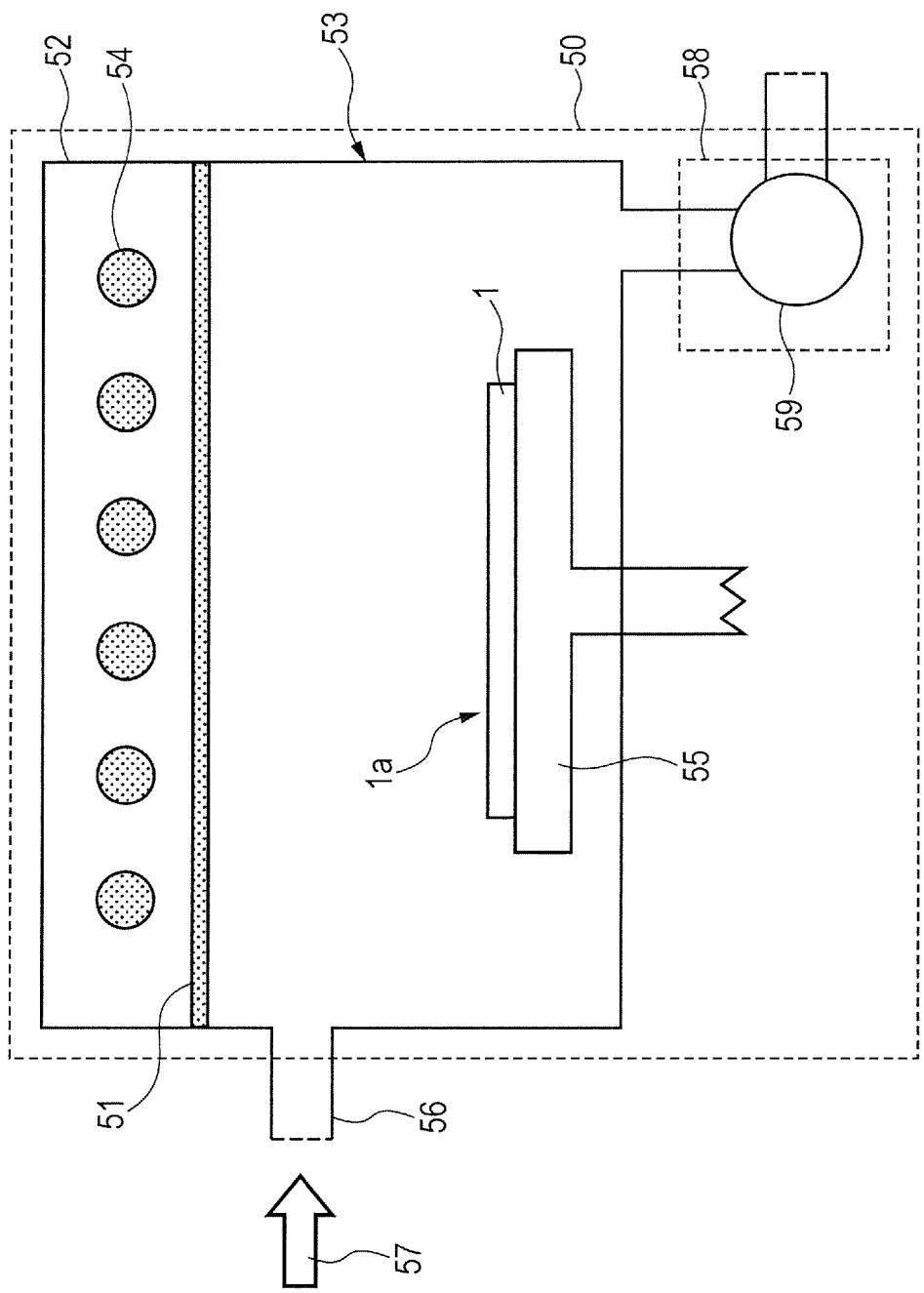
FIG. 15 is an exemplary device cross-sectional view showing one example of an ultraviolet ray irradiation device 50 used in a far-ultraviolet ray irradiation step 102d shown in FIG. 9.
Figure 16:
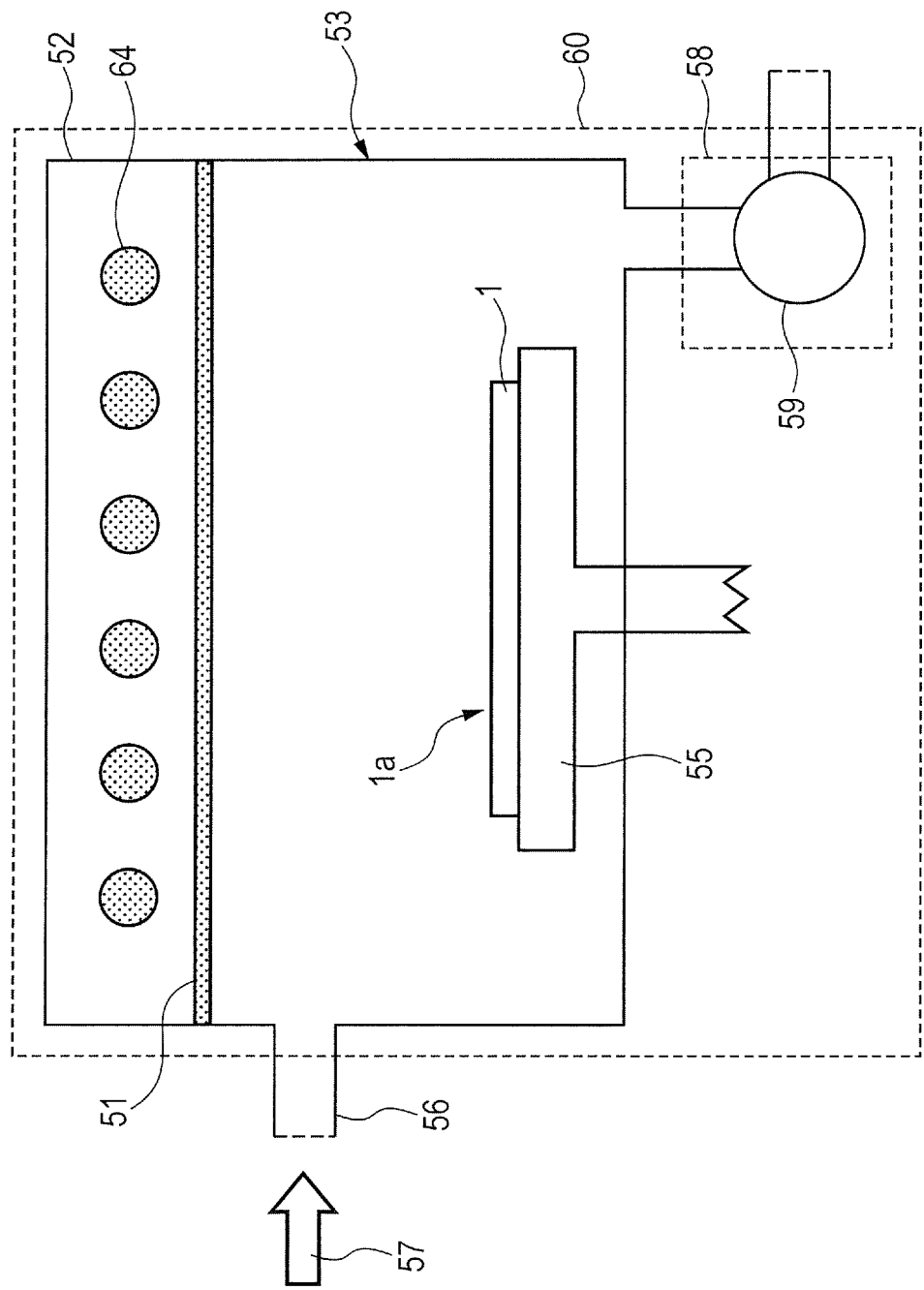
FIG. 16 is an exemplary device cross-sectional view showing one example of a heat treatment device 60 used in a heat treatment step 102e shown in FIG. 9.
Figure 17:
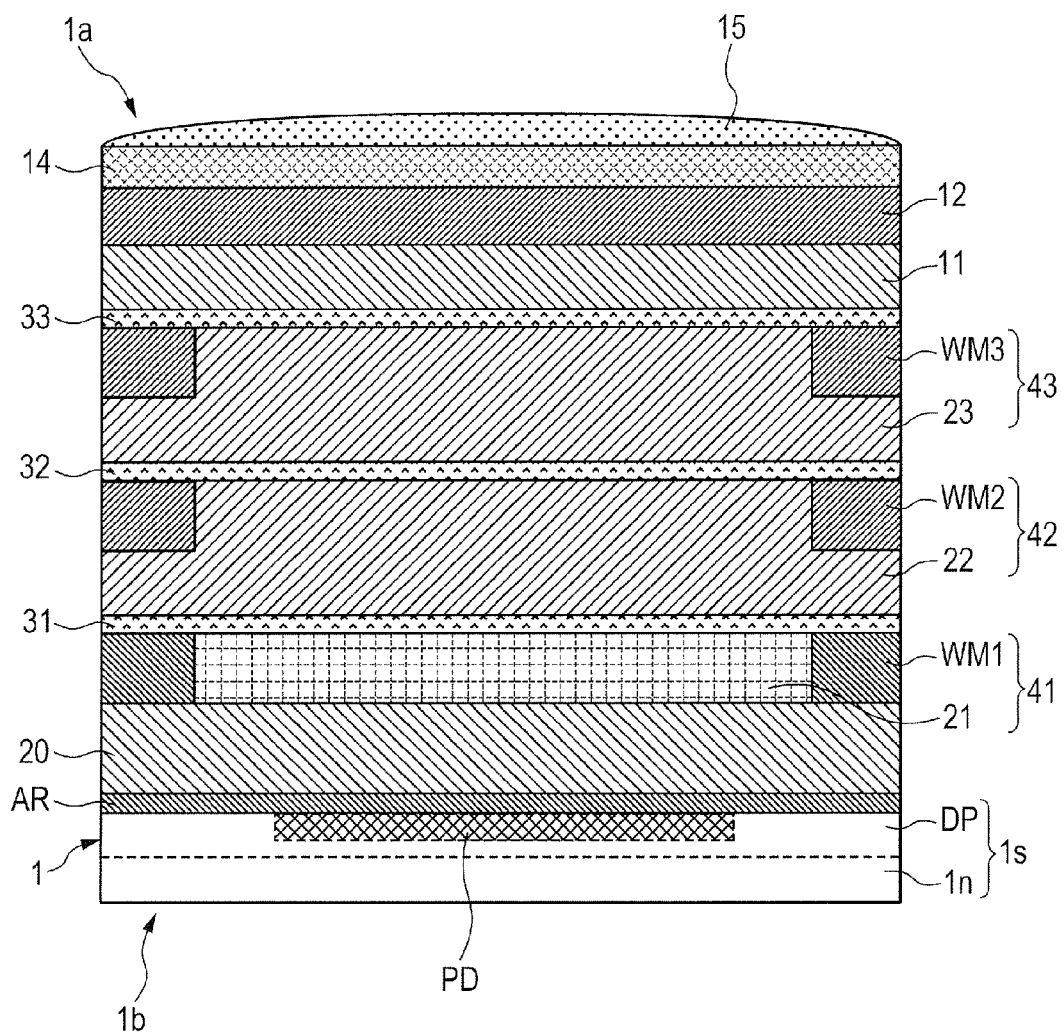
FIG. 17 is a device cross-sectional view of parts corresponding to FIG. 6 for explaining a process flow or the like in the pixel region PX in a manufacturing step (color filter layer & microlens layer formation step) of the CMOS image sensor (of the surface-irradiation type) in the manufacturing method of the semiconductor integrated circuit device in the one embodiment of the present application.

FIG. 8 is a partial layout diagram of an upper surface of a semiconductor wafer illustrating the arrangement of chip regions at a wafer surface, for explaining the process flow or the like in a main manufacturing procedure for the CMOS image sensor (of the surface-irradiation type) obtained by the manufacturing method of the semiconductor integrated circuit device in the one embodiment of the present application. FIG. 9 is a main process block flowchart for explaining the process flow or the like in the main manufacturing procedure for the CMOS image sensor (of the surface-irradiation type) obtained by the manufacturing method of the semiconductor integrated circuit device in the one embodiment of the present application. FIG. 10 is a device cross-sectional view of parts corresponding to FIG. 6 for explaining the process flow or the like in the pixel region PX in a manufacturing step (semiconductor substrate treatment step) of the CMOS image sensor (of the surface-irradiation type) in the manufacturing method of the semiconductor integrated circuit device in the one embodiment of the present application. FIG. 11 is a device cross-sectional view of parts corresponding to FIG. 6 for explaining a process flow or the like in the pixel region PX in a manufacturing step (multi-layer wiring formation step) of the CMOS image sensor (of the surface-irradiation type) in the manufacturing method of the semiconductor integrated circuit device in the one embodiment of the present application. FIG. 12 is a device cross-sectional view of parts corresponding to FIG. 7 for explaining a process flow or the like in the pad formation region 9 in a manufacturing step (multi-layer wiring formation step) of the CMOS image sensor (of the surface-irradiation type) in the manufacturing method of the semiconductor integrated circuit device in the one embodiment of the present application. FIG. 13 is a device cross-sectional view of parts corresponding to FIG. 6 for explaining a process flow or the like in the pixel region PX in a manufacturing step (formation step of the passivation film over the pad layer) of the CMOS image sensor (of the surface-irradiation type) in the manufacturing method of the semiconductor integrated circuit device in the one embodiment of the present application. FIG. 14 is a device cross-sectional view of parts corresponding to FIG. 7 for explaining a process flow or the like in the pad formation region 9 in the manufacturing step (formation step of the passivation film over the pad layer) of the CMOS image sensor (of the surface-irradiation type) in the manufacturing method of the semiconductor integrated circuit device in the one embodiment of the present application. FIG. 15 is an exemplary device cross-sectional view showing one example of an ultraviolet ray irradiation device 50 used in a far-ultraviolet ray irradiation step 102*d* shown in FIG. 9. FIG. 16 is an exemplary device cross-sectional view showing one example of a heat treatment device 60 used in the heat treatment step 102*e* shown in FIG. 9. FIG. 17 is a device cross-sectional view of parts corresponding to FIG. 6 for explaining a process flow or the like in the pixel region PX in a manufacturing step (color filter layer & microlens layer formation step) of the CMOS image sensor (of the surface-irradiation type) in the manufacturing method of the semiconductor integrated circuit device in the one embodiment of the present application. Referring to these figures, a description will be given of the process flow or the like in the main manufacturing procedure of the CMOS image sensor (of the surface-irradiation type) in the manufacturing method of the semiconductor integrated circuit device according to the one embodiment of the present application.

First, as shown in FIG. 8, an N-type monocrystalline silicon wafer 1 (semiconductor wafer) having a diameter of, for example, about 300Φ, is provided (to have a thickness of, for example, about 800 nm). The chip regions 2 are provided over the surface 1*a* (first main surface) of the wafer 1 in a matrix (in a rectangular lattice). Note that the diameter of the wafer 1 is not limited to about 300Φ, and may obviously be about 450Φ, about 200Φ, or any other value. The conduction type of the wafer 1 is not limited to the N type, and may be a P type as needed. The form of the wafer 1 is not limited to the monocrystalline silicon wafer, that is, a non-epitaxial wafer, and may be an epitaxial wafer.

Next, manufacturing steps will be described in turn according to the flowchart of FIG. 9.

FIG. 10 shows the device section (in the pixel region) upon completion of a semiconductor substrate treatment step 101 shown in FIG. 9. As shown in FIG. 10, the p-type deep well region DP is selectively formed in the surface 1*a* of the wafer 1 (1*s*), for example, by ion implantation or the like.

Then, the photodiode PD is formed on or in the vicinity of the surface of the P-type deep well region DP, for example, in combination with the ion implantation or the like. Thereafter, the antireflection film AR is deposited over the surface 1a of the wafer 1 (1s), for example, by a chemical vapor deposition (CVD) or the like. The antireflection film AR (having a thickness of, for example, about 90 nm) can preferably include a multi-layer film comprised of, for example, a silicon nitride film, a silicon oxide film, and the like.

Thereafter, for example, unnecessary parts of the antireflection film AR are removed, for example, by normal lithography as needed.

Next, a multi-layer wiring formation step 102 shown in FIG. 9 will be described. As shown in FIG. 11 (pixel region) and FIG. 12 (pad formation region), the premetal insulating film 20 (having a thickness of, e.g., about 250 nm) made of a silicon oxide-based insulating film as a main component film, such as a silicon oxide film, is deposited over the antireflection film AR and the field insulating film 3, for example, by the CVD and the like. The premetal insulating film 20 can preferably include, for example, a high density plasma (HDP)-SiO$_2$ film. Note that the field insulating film 3 is formed, for example, during the semiconductor substrate treatment step 101 shown in FIG. 9.

Then, the first-wiring-layer main insulating film 21 (having a thickness of, e.g. about 170 nm) made of a silicon oxide-based insulating film, such as a SiOC film, as a main component film is deposited over the premetal insulating film 20, for example, by the plasma CVD or the like. Next, the first metal wiring layer WM1, such as a copper embedded wiring, is embedded in the first-wiring-layer main insulating film 21, for example, by the single damascene method or the like (in a first embedded wiring layer formation step 102a shown in FIG. 9). Then, the insulating barrier film 31 over the first metal wiring layer (having a thickness of, e.g. about 30 nm) made of a silicon nitride-based insulating film, such as a SiCN film, as a main component film is deposited, for example, by the plasma CVD or the like.

Then, the second-wiring-layer main insulating film 22 (having a thickness of, e.g. about 350 nm) made of a silicon oxide-based insulating film, such as a SiOC film, as a main component film is deposited over the insulating barrier film 31 over the first metal wiring layer, for example, by the plasma CVD or the like. Thereafter, the second metal wiring layer WM2, such as a copper embedded wiring, is embedded in the second-wiring-layer main insulating film 22, for example, by a dual damascene method or the like. Then, the insulating barrier film 32 over the second metal wiring layer (having a thickness of, e.g. about 30 nm) made of, for example, a silicon nitride-based insulating film, such as a SiCN film, as a main component film is deposited, for example, by the plasma CVD or the like.

Then, the third-wiring-layer main insulating film 23 (having a thickness of, e.g. about 600 nm) made of a silicon oxide-based insulating film, such as a SiOC film, as a main component film is deposited over the insulating barrier film 32 over the second metal wiring layer, for example, by the plasma CVD or the like. Thereafter, the third metal wiring layer WM3, such as a copper embedded wiring, is embedded in the third-wiring-layer main insulating film 23, for example, by the dual damascene method or the like (in an uppermost embedded wiring layer formation step 102b shown in FIG. 9). Then, the insulating barrier film 33 over the third metal wiring layer (having a thickness of, e.g. about 80 nm) made of, for example, a silicon nitride-based insulating film, such as a SiCN film, as a main component film is deposited, for example, by the plasma CVD or the like. Next, the insulating film 11 (having a thickness of, e.g. about 300 nm) under the pad layer is deposited over the insulating barrier film 33 over the third metal wiring layer, for example, by the plasma CVD or the like. The insulating film 11 under the pad layer is made of a silicon oxide-based insulating film, such as a SiOC film, as a main component film.

Then, as shown in FIG. 14 (corresponding to the pad formation region), the pad layer via hole 10 is formed in the insulating film 11 under the pad layer and the insulating barrier film 33 over the third metal wiring layer, for example, by anisotropic dry etching and the like. Thereafter, an aluminum-based metal film or the like (for example, upper and lower titanium nitride films) is deposited over the insulating film 11 under the pad layer and within the pad layer via hole 10, for example, by sputtering or the like, and then is patterned, for example, by normal lithography, thereby forming the bonding pad 19 (pad layer metal wiring). Note that the thickness of the aluminum-based metal film can be, for example, approximately 800 nm, and each of the upper and lower titanium nitride films can be preferably, for example, approximately 50 nm, by way of example.

As shown in FIG. 13 (pixel region) and FIG. 14 (pad formation region), the passivation film 12 over the pad layer (having a thickness of, e.g., about 400 nm) made of a silicon nitride-based insulating film, such as a silicon nitride film, as a main component film, is deposited over the insulating film 11 under the pad layer and the bonding pad 19, for example, by the plasma CVD and the like. In the present application, the insulating film including the silicon nitride-based insulating film as the main component film is sometimes called "the glass coating".

Thereafter, the pad opening 18 (having a width of, e.g., about 100 μm) is formed above the bonding pad 19, for example, by the anisotropic dry etching or the like. A step from the deposition of the insulating film 11 under the pad layer up to the formation of the pad opening 18 corresponds to a pad wiring layer formation step 102c shown in FIG. 9.

Then, the far-ultraviolet ray irradiation step 102d shown in FIG. 9 is performed, for example, using the ultraviolet ray irradiation device 50 shown in FIG. 15. Referring to FIG. 15, the outline of the ultraviolet ray irradiation device 50 and the far-ultraviolet ray irradiation step 102d will be described below. As shown in FIG. 15, during the far-ultraviolet ray irradiation step 102d, the wafer 1 to be processed is mounted, for example, with its surface 1a facing upward, on a wafer stage 55 installed in a wafer processing chamber 53. A lamp chamber 52 is provided above the wafer processing chamber 53 via a transparent partition 51 (for example, quartz glass etc.). For example, a plurality of far ultraviolet lamps 54 is installed in the lamp chamber 52. Note that the lamp serving as a light source is not limited to the far ultraviolet lamp, and may be a normal lamp that emits ultraviolet rays. In the far-ultraviolet ray irradiation process, for example, atmosphere gas 57 for the far-ultraviolet ray irradiation process is supplied to the wafer processing chamber 53 via the gas supply port 56, and air is exhausted from the wafer processing chamber to the outside via a vacuum exhaust system 58 with a vacuum pump 59. The wafer processing chamber 53 is kept, for example, in a predetermined decompressed state. Note that obviously, the decompressed state is not essential.

By way of example, conditions for the far-ultraviolet ray irradiation process are as follows. That is, for example, light source: far ultraviolet lamp (see FIG. 28 for details), radiation intensity: about 2000 watt/m2, irradiation time: about 300 seconds, wafer surface temperature: ordinary temperature (in irradiation, the temperature sometimes increases by about several tens of degrees), atmospheric pressure of the processing chamber: about 13 kPa, and gas atmosphere: nitrogen.

The far-ultraviolet irradiation process is performed after formation of the passivation film 12 over the pad layer, which is convenient in terms of process. Alternatively, the far-ultraviolet irradiation process may be performed before or earlier than deposition of the passivation film 12 over the pad layer, or during the formation of the passivation film 12 over the pad layer or the like (for example, after deposition of the lower-layer silicon oxide film and before deposition of the upper-layer silicon nitride film, and the like) . Such a preceding far-ultraviolet irradiation process is considered to have a large effect of recovery of defects or the like. On the other hand, after deposition of the glass coating or the like, the far-ultraviolet irradiation process is performed around and together the heat treatment step 102e, which is effective in simplifying the manufacturing procedure.

Then, the heat treatment step 102e shown in FIG. 9 is performed, for example, using the heat treatment device 60 shown in FIG. 16. Referring to FIG. 16, the outline of the heat treatment device 60 and the heat treatment step 102e will be described below. As shown in FIG. 16, during the heat treatment step 102e, the wafer 1 to be processed is mounted with its surface 1a facing upward, on the wafer stage 55 installed in the wafer processing chamber 53. The lamp chamber 52 is provided above the wafer processing chamber 53 via the transparent partition 51 (for example, quartz glass etc.). For example, a plurality of heating lamps 64 (for example, infrared lamps) is installed in the lamp chamber 52. In the heat treatment after the far-ultraviolet ray irradiation process, for example, the atmosphere gas 57 for the heat treatment is supplied to the wafer processing chamber 53 via the gas supply port 56, and then air is exhausted to the outside via the vacuum exhaust system 58 with the vacuum pump 59. The wafer processing chamber 53 is kept, for example, at ordinary pressure. Note that obviously, the ordinary pressure is not essential.

By way of example, conditions for the heat treatment process are as follows. That is, for example, wafer surface temperature: about 420° C., atmospheric pressure in processing chamber: ordinary pressure, gas atmosphere: hydrogen forming gas (of approximately 95% nitrogen and 5% hydrogen), and heat treatment time: about 30 minutes.

The heat treatment process is performed after formation of the passivation film 12 over the pad layer, which is effective from the viewpoint of recovery of defects and the like. The heat treatment process may be performed before or earlier than deposition of the passivation film 12 over the pad layer, or during the formation of the passivation film 12 over the pad layer or the like (for example, after deposition of the lower-layer silicon oxide film and before deposition of the upper-layer silicon nitride film, and the like). When the passivation film 12 over the pad layer is comprised of, for example, a lower-layer silicon oxide film, an intermediate-layer silicon nitride film, and an upper-layer silicon oxide film, for example, the heat treatment may be performed between depositions of the silicon nitride film and the upper-layer silicon oxide film.

After the ultraviolet ray irradiation step and the heat treatment step performed after the ultraviolet ray irradiation step, as shown in FIG. 17, in the pixel region, for example, the color filter layer 14 is formed over the passivation film 12 over the pad layer (in a color filter layer formation step 121 shown in FIG. 9). Next, the microlens layer 15 is formed over the color filter layer 14 in the pixel region (in a microlens layer formation step 122 shown in FIG. 9)

Thereafter, a wafer thinning process (including a backside grinding process, a backside CMP process, a backside etching process, and the like as needed) is performed on the backside lb of the wafer 1 as necessary. The backside of the wafer 1 subjected to the thinning process undergoes a dicing process or the like while being attached to, e.g., a dicing tape or the like to be divided into individual chips 2. Then, an assembly process (for example, chip bonding, wire bonding, sealing, or the like) is performed as appropriate.

5. Detailed explanation of the device structure or the like in the pixel region and pad formation region of the CMOS image sensor (of the backside-irradiation type) obtained by a modified example of the manufacturing method of the semiconductor integrated circuit device according to the one embodiment of the present application (see mainly FIGS. 18 and 19)

An example described in this section is a modified example (a backside-irradiation type image sensor) regarding the device structure of the examples described in sections 1 to 4 (basic examples, that is, a surface-irradiation type image sensor), and thus the structures of basic parts (material, dimension, and others) of the modified example are substantially the same as those of the basic examples. Thus, in the description below, only different parts will be mainly described in principle. Note that in the following, FIG. 18 corresponds to FIG. 6, and FIG. 19 corresponds to FIG. 7.

Figure 18:
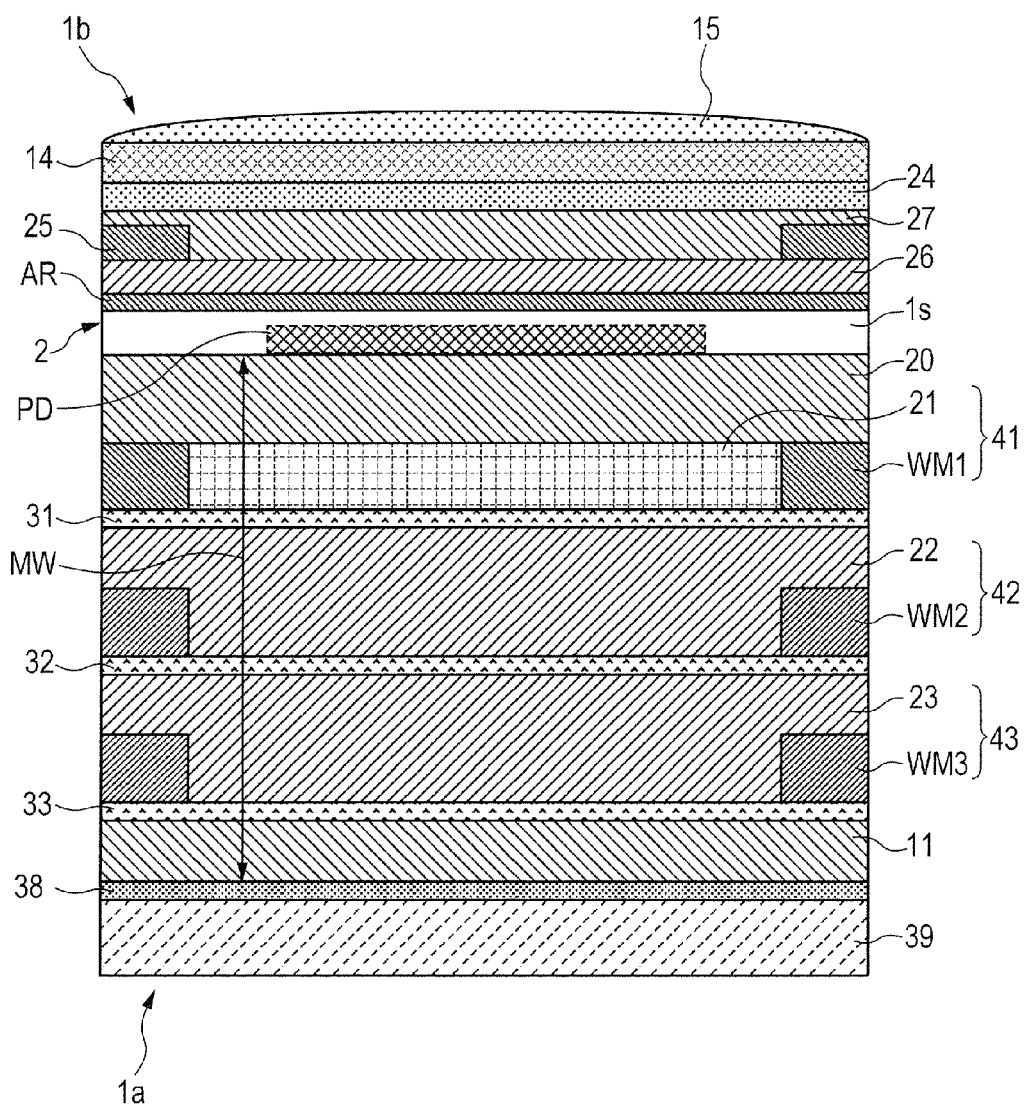
FIG. 18 is a device cross-sectional view taken along the line X-X' of FIG. 4 for explaining the details of the device structure or the like in the pixel region PX (see FIGS. 2 and 3) of the CMOS image sensor (of a backside-irradiation type) obtained by a modified example of the manufacturing method of the semiconductor integrated circuit device in the one embodiment of the present application.
Figure 19:
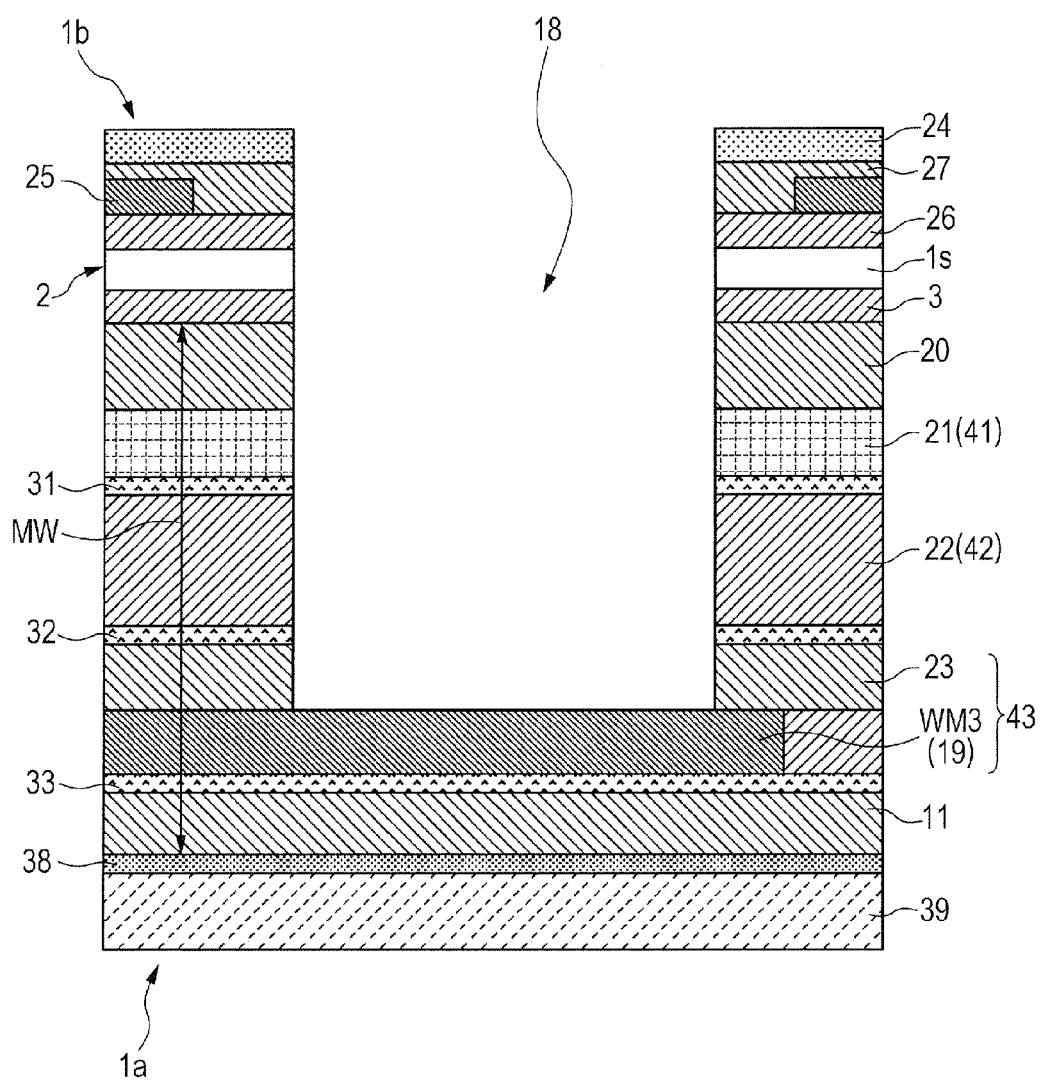
FIG. 19 is a device cross-sectional view for explaining the details of the device structure or the like in the pad formation region 9 (see FIG. 1) of the CMOS image sensor (of the backside-irradiation type) obtained by a modified example of the manufacturing method of the semiconductor integrated circuit device in the one embodiment of the present application.

FIG. 18 is a device cross-sectional view taken along the line X-X' of FIG. 4 for explaining the details of the device structure or the like in the pixel region PX (see FIGS. 2 and 3) of the CMOS image sensor (of the backside-irradiation type) obtained by a modified example of the manufacturing method of the semiconductor integrated circuit device in the one embodiment of the present application. FIG. 19 is a device cross-sectional view for explaining the details of the device structure or the like of a pad formation region 9 (see FIG. 1) of the CMOS image sensor (of the backside-irradiation type) obtained by a modified example of the manufacturing method of the semiconductor integrated circuit device in the one embodiment of the present application. Referring to these figures, a detailed description will be given of the device structure or the like of the pixel region and the pad formation region in the CMOS image sensor (of the backside-irradiation type) obtained by the modified example of the manufacturing method of the semiconductor integrated circuit device in the one embodiment of the present application.

As shown in FIG. 18 (pixel region) and FIG. 19 (pad formation region), for example, the insulating film 11 under the pad layer is arranged over the upper surface of the package substrate 39 (wiring board), for example, via a die bonding agent layer 38. The insulating barrier film 33 over the third metal wiring layer is arranged over the insulating film 11 under the pad layer. The third-wiring-layer main insulating film 23 is arranged over the insulating barrier film 33 over the third metal wiring layer. The third metal wiring layer WM3 is embedded in the third-wiring-layer main insulating film 23. Note that the position of the third metal wiring layer WM3 in the third-wiring-layer main insulating film 23 is vertically opposite to that shown in FIG. 6 (the same goes for the following matters).

The insulating barrier film 32 over the second metal wiring layer is arranged over the third-wiring-layer main insulating film 23. The second-wiring-layer main insulating film 22 is arranged over the insulating barrier film 32 over the second metal wiring layer. The second metal wiring layer WM2 is embedded in the second-wiring-layer main insulating film 22.

The insulating barrier film 31 over the first metal wiring layer is arranged over the second-wiring-layer main insulating film 22. The first-wiring-layer main insulating film 21 is arranged over the insulating barrier film 31 over the first metal wiring layer. The first metal wiring layer WM1 is embedded in the first-wiring-layer main insulating film 21.

The premetal insulating film 20 is arranged over the first-wiring-layer main insulating film 21, and over the first metal wiring layer WM1. In this example, the premetal insulating film 20 is an N-type monocrystalline silicon substrate 1s (semiconductor substrate). The photodiode PD is provided in the semiconductor substrate 1s.

For example, the antireflection film AR is formed over the backside 1b (the second main surface) of the semiconductor substrate 1s. An insulating film 26 under a shielding metal film (the insulating film under a light shielding film) is provided over the antireflection film AR. For example, a shielding metal film 25 (light shielding film) is provided over the insulating film 26 under the shielding metal film. For example, a passivation film 27 over the shielding metal film (passivation film over the light shielding film) is provided over the shielding metal film 25 and over the insulating film 26 under the shielding metal film. Above the passivation film 27 over the shielding metal film, for example, an organic planarizing insulating film 24 (e.g., polyimide resin film) is provided.

Further, in the pixel region PX, for example, the color filter layer 14 and the microlens layer 15 are provided over the organic planarizing insulating film 24.

On the other hand, in the pad formation region 9 (pad portion), the pad opening 18 is provided to extend from the side of the backside 1b of the chip 2 to the bonding pad 19 comprised of the third metal wiring layer WM3.

In this example, the multi-layer wiring layer MW covers the area from around the premetal insulating film 20 up to the insulating film 11 under the pad layer.

An inner lens layer made of, e.g., a silicon nitride film or the like, may be inserted into, for example, between the passivation film 27 over the shielding metal film and the organic planarizing insulating film 24. In this case, a planarizing film made of, for example, polyimide resin etc., is normally applied to the inner lens layer to planarize its surface. Alternatively, the inner lens layer may be formed of the silicon nitride film forming the passivation film 27 over the shielding metal film.

6. Explanation of the process flow or the like in a main manufacturing procedure of the CMOS image sensor (of the backside-irradiation type) obtained by a modified example of the manufacturing method of the semiconductor integrated circuit device according to the one embodiment of the present application (see mainly FIGS. 20 to 26)

An example described in this section is a modified example of the manufacturing method described in the section 4. The example in this section has the same or similar basic parts as those in other sections, except for a part of the device structure, and a part of the process flow together with the part of the device structure. Now, only the different part will be mainly described in principle.

Figure 20:
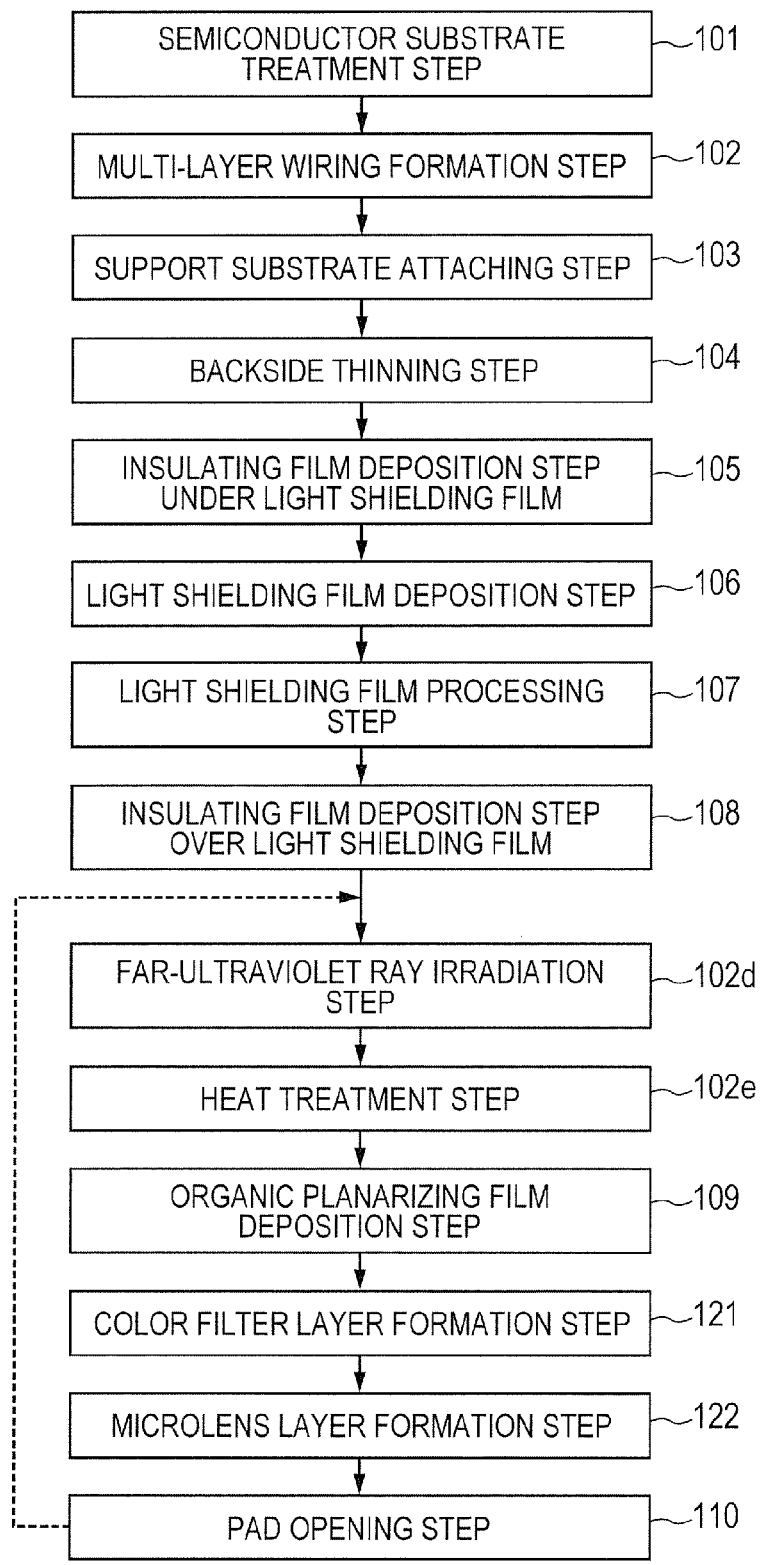
FIG. 20 is a main process block flowchart for explaining the process flow or the like in a main manufacturing procedure for the CMOS image sensor (of the backside-irradiation type) obtained by a modified example of the manufacturing method of the semiconductor integrated circuit device in the one embodiment of the present application.
Figure 21:
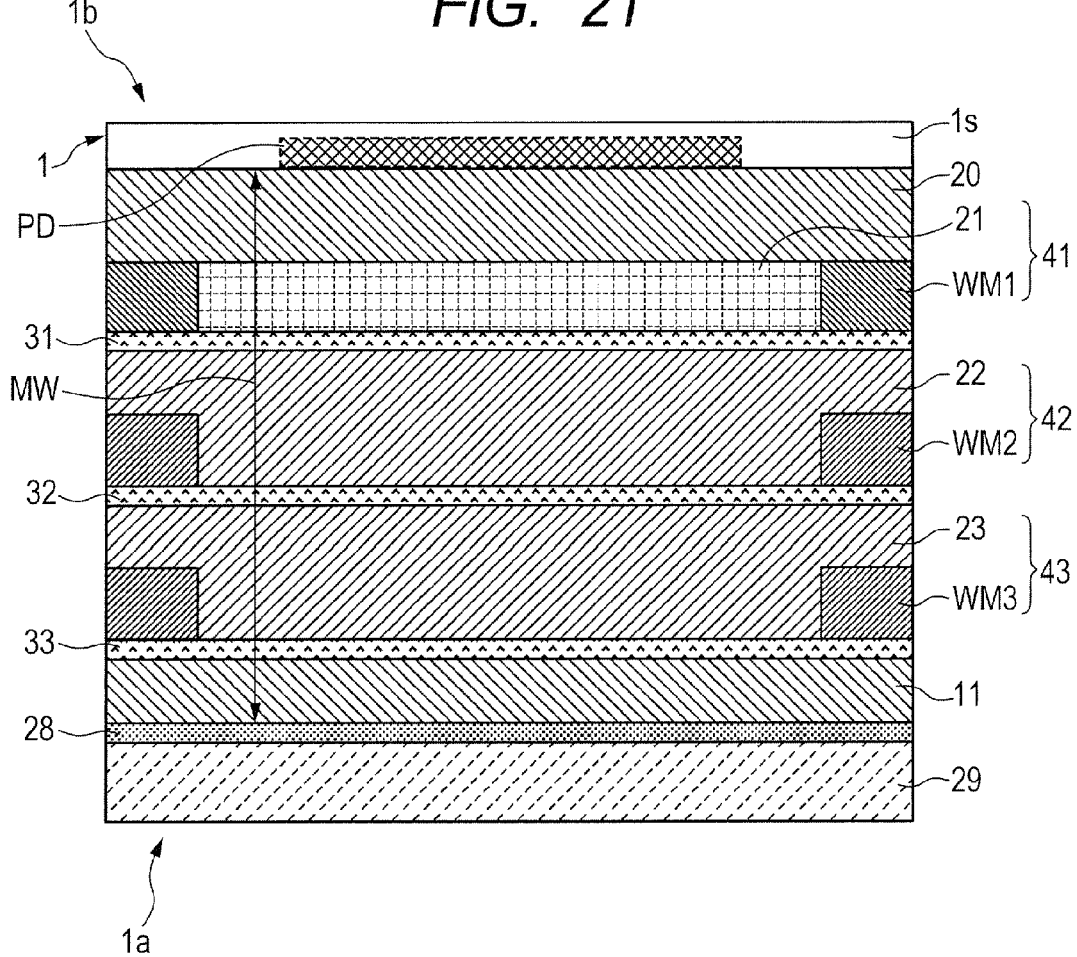
FIG. 21 is a device cross-sectional view of parts corresponding to FIG. 18 for explaining a process flow or the like in the pixel region PX in a manufacturing step (backside support substrate attaching step) of the CMOS image sensor (of the backside-irradiation type) in the modified example of the manufacturing method of the semiconductor integrated circuit device in the one embodiment of the present application.
Figure 22:
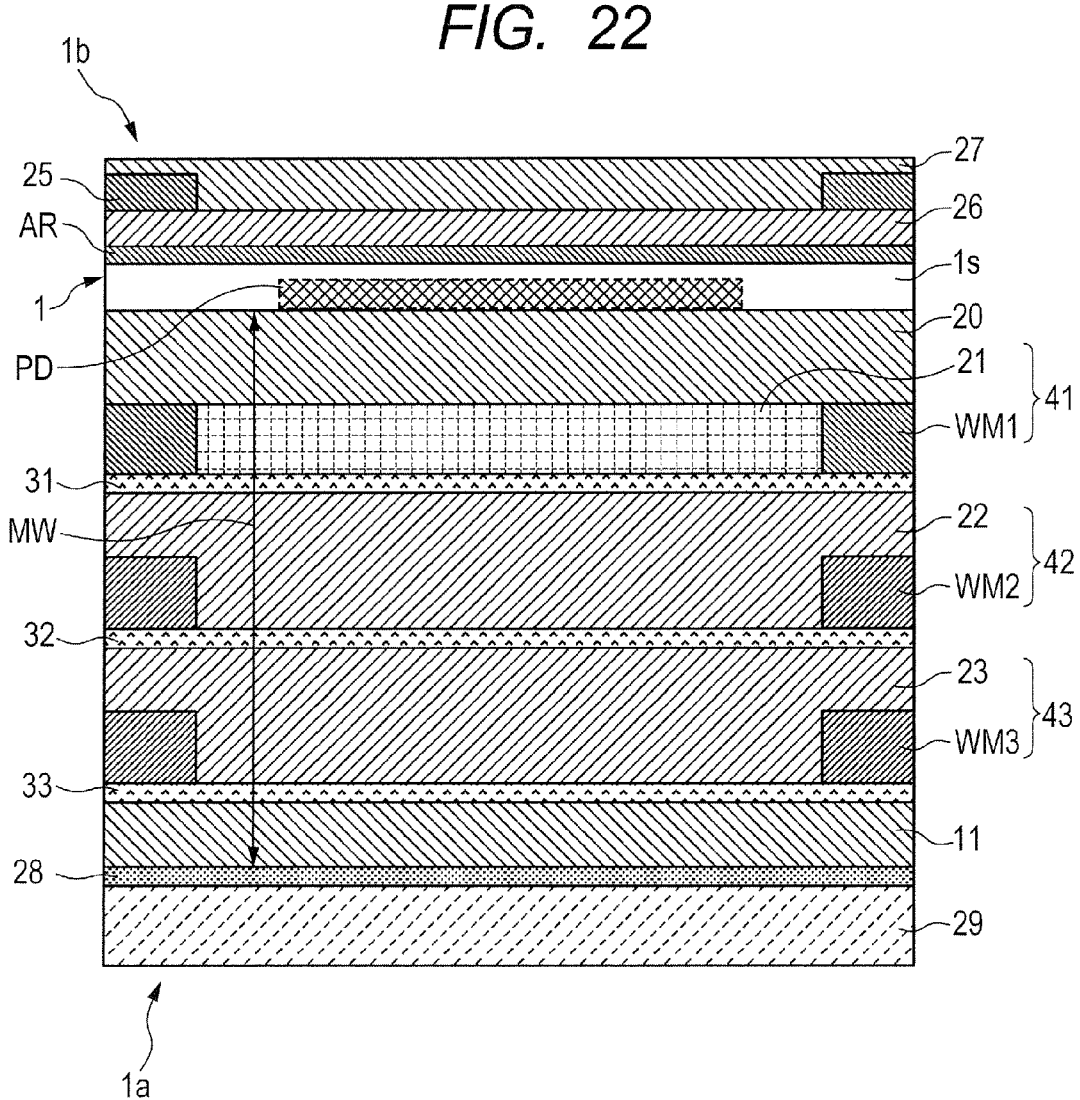
FIG. 22 is a device cross-sectional view of parts corresponding to FIG. 18 for explaining a process flow or the like in the pixel region PX in a manufacturing step (formation step of the shielding film etc.) of the CMOS image sensor (of the backside-irradiation type) in the modified example of the manufacturing method of the semiconductor integrated circuit device in the one embodiment of the present application.
Figure 23:
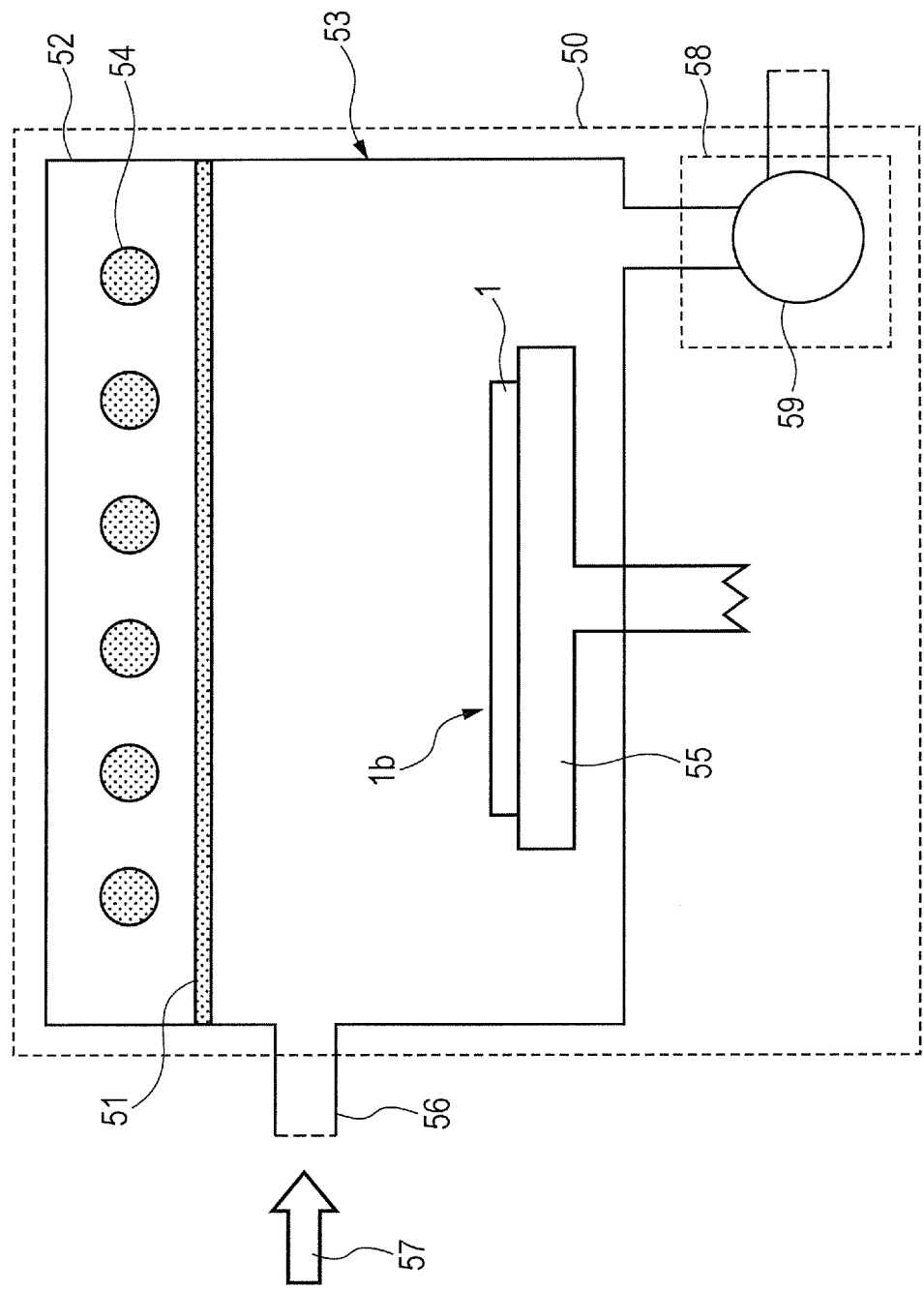
FIG. 23 is an exemplary device cross-sectional view showing one example of the ultraviolet ray irradiation device 50 used in the far-ultraviolet ray irradiation step 102d shown in FIG. 20.
Figure 24:
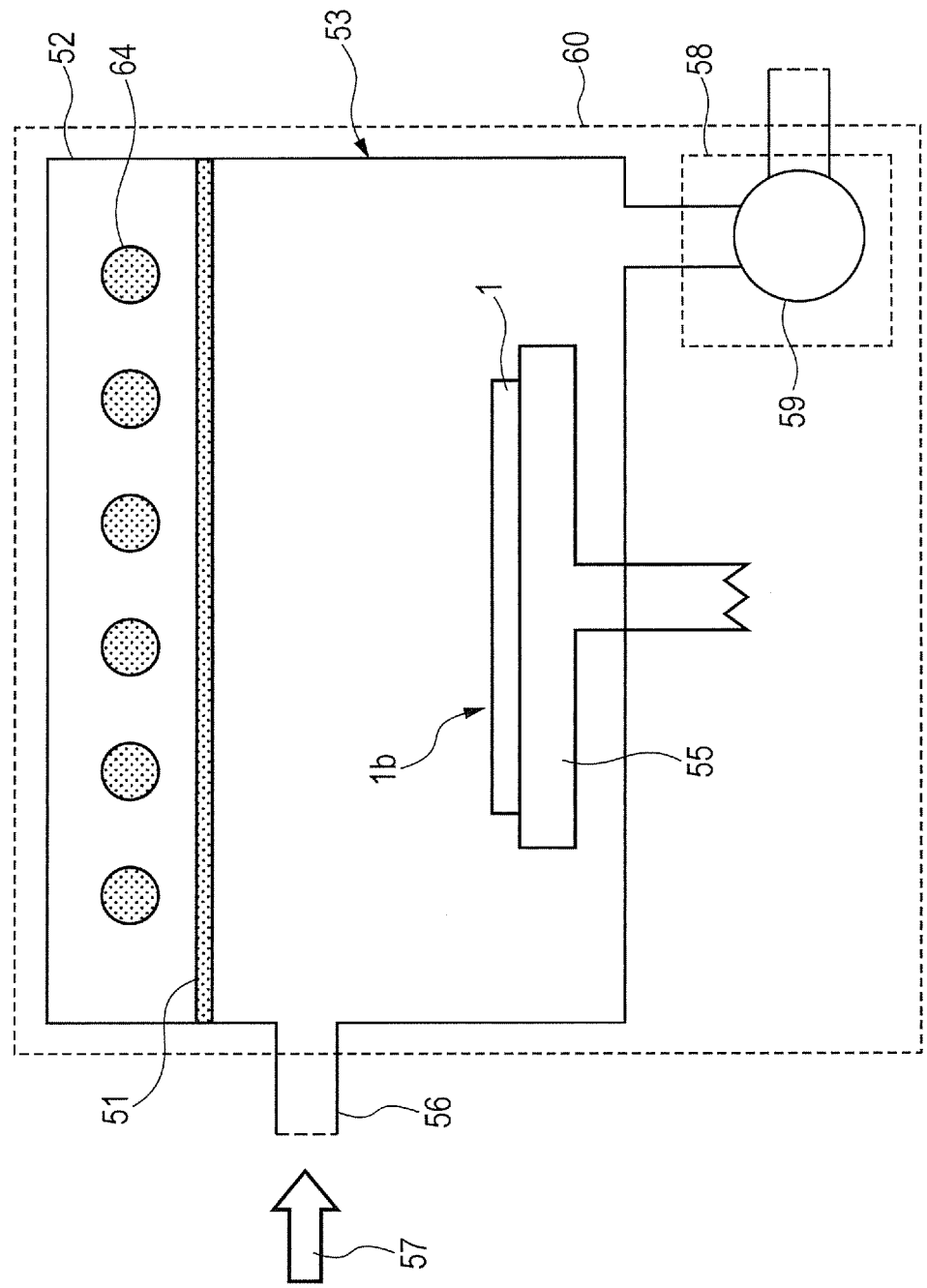
FIG. 24 is an exemplary device cross-sectional view showing one example of the heat treatment device 60 used in the heat treatment step 102e shown in FIG. 20.
Figure 25:
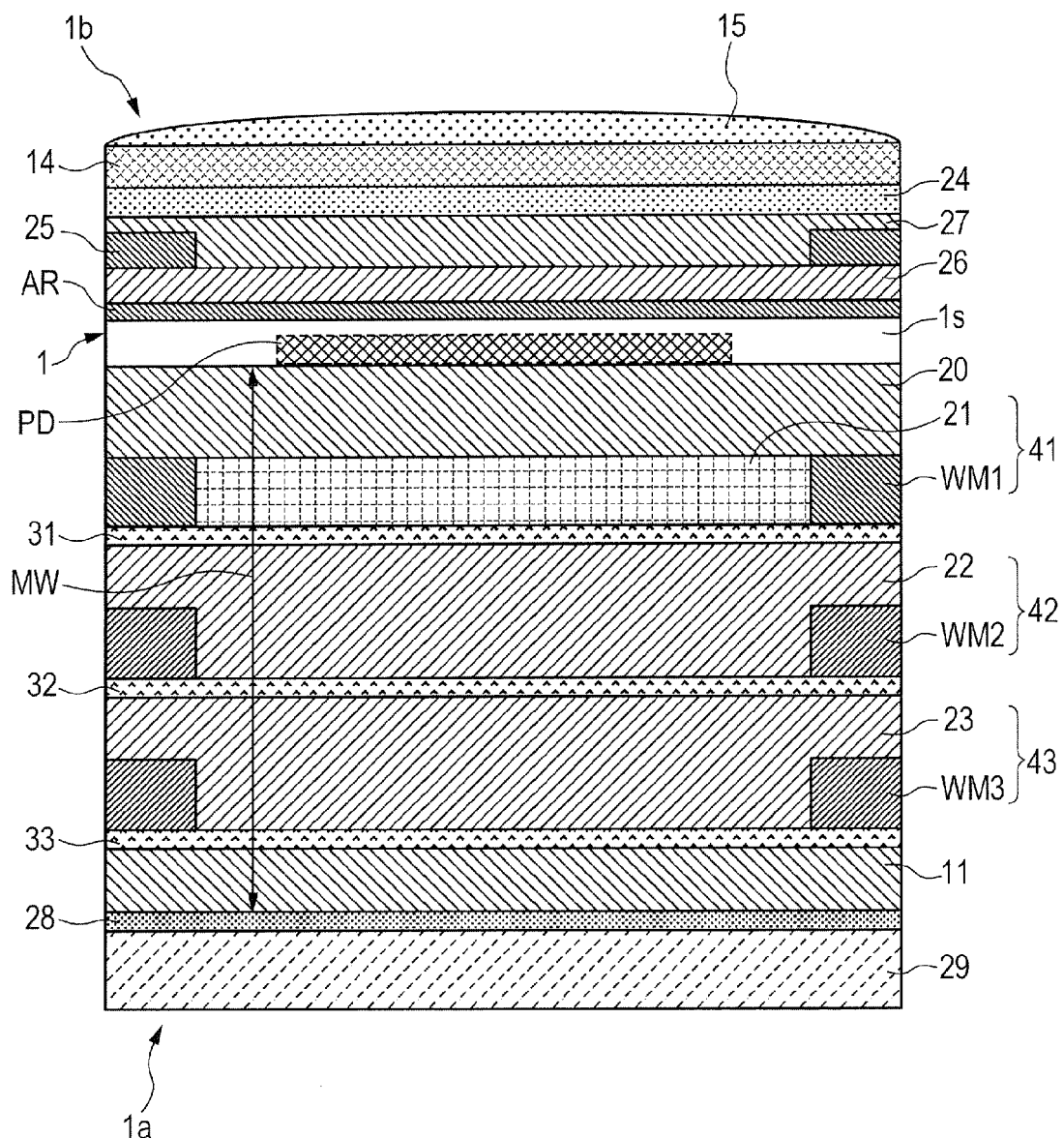
FIG. 25 is a device cross-sectional view of parts corresponding to FIG. 18 for explaining a process flow or the like in the pixel region PX in a manufacturing step (color filter layer & microlens layer formation step) of the CMOS image sensor (of the backside-irradiation type) in the modified example of the manufacturing method of the semiconductor integrated circuit device in the one embodiment of the present application.
Figure 26:
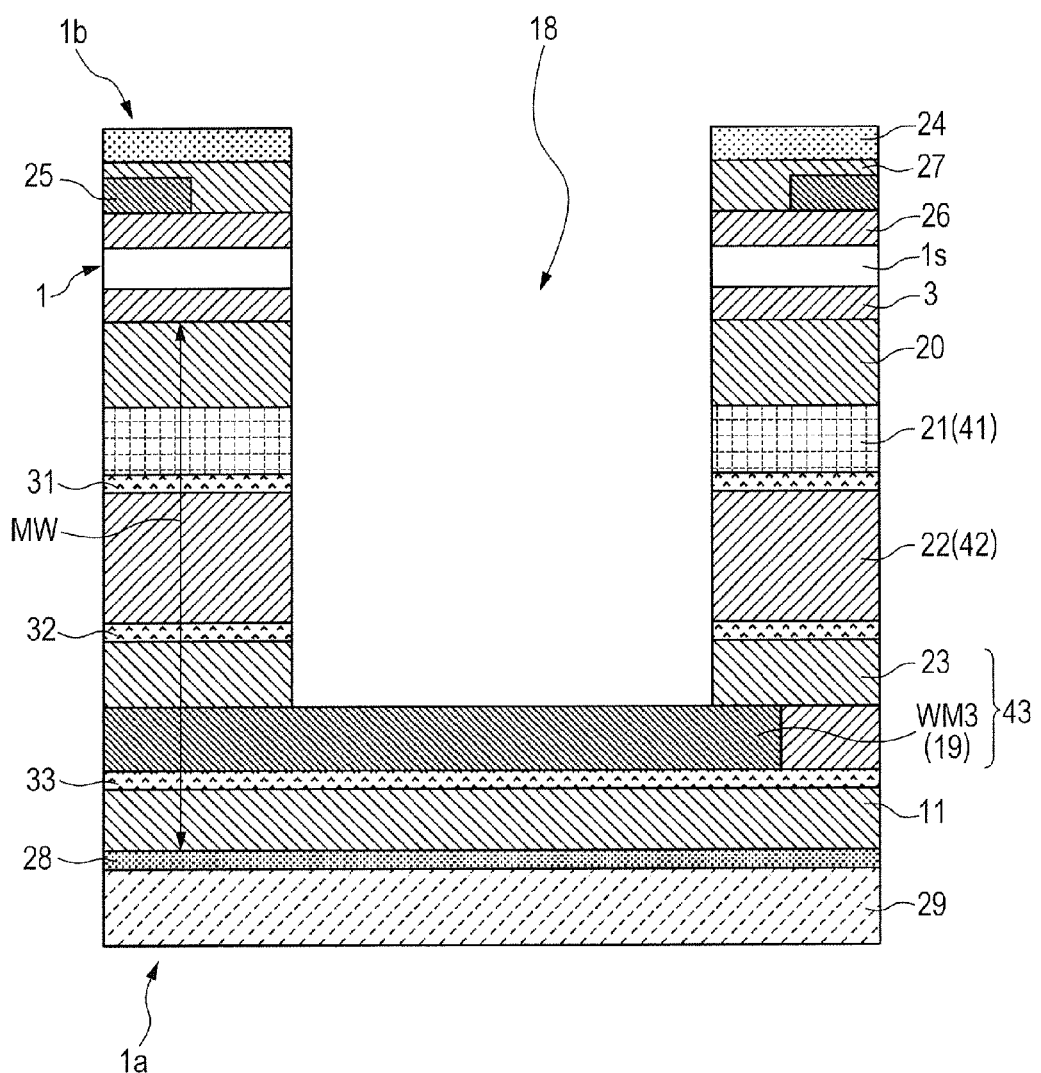
FIG. 26 is a device cross-sectional view of parts corresponding to FIG. 18 for explaining a process flow or the like in the pad formation region 9 in a manufacturing step (pad opening step) of the CMOS image sensor (of the backside-irradiation type) in the modified example of the manufacturing method of the semiconductor integrated circuit device in the one embodiment of the present application.

FIG. 20 is a main process block flowchart for explaining a process flow or the like in a main manufacturing procedure for the CMOS image sensor (of the backside-irradiation type) obtained by a modified example of the manufacturing method of the semiconductor integrated circuit device in the one embodiment of the present application. FIG. 21 is a device cross-sectional view of parts corresponding to FIG. 18 for explaining a process flow or the like in the pixel region PX in a manufacturing step (backside support substrate attaching step) of the CMOS image sensor (of the backside-irradiation type) obtained by the modified example of the manufacturing method of the semiconductor integrated circuit device in the one embodiment of the present application. FIG. 22 is a device cross-sectional view of parts corresponding to FIG. 18 for explaining a process flow or the like in the pixel region PX in a manufacturing step (shielding film formation step or the like) of the CMOS image sensor (of the backside-irradiation type) obtained by the modified example of the manufacturing method of the semiconductor integrated circuit device in the one embodiment of the present application. FIG. 23 is an exemplary device cross-sectional view showing one example of the ultraviolet ray irradiation device 50 used in the far-ultraviolet ray irradiation step 102d shown in FIG. 20. FIG. 24 is an exemplary device cross-sectional view showing one example of the heat treatment device 60 used in a heat treatment step 102e shown in FIG. 20. FIG. 25 is a device cross-sectional view of parts corresponding to FIG. 18 for explaining a process flow or the like in the pixel region PX in a manufacturing step (color filter layer & microlens layer formation step) of the CMOS image sensor (of the surface-irradiation type) obtained by a modified example of the manufacturing method of the semiconductor integrated circuit device according to the one embodiment of the present application. FIG. 26 is a device cross-sectional view of parts corresponding to FIG. 18 for explaining a process flow or the like in the pad formation region 9 in a manufacturing step (pad opening step) of the CMOS image sensor (of the backside-irradiation type) obtained by the modified example of the manufacturing method of the semiconductor integrated circuit device according to the one embodiment of the present application. Referring to these figures, a description will be given of the process flow or the like in the main manufacturing procedure of the CMOS image sensor (of the backside-irradiation type) obtained by a modified example of the manufacturing method of the semiconductor integrated circuit according to the one embodiment of the present application.

Like FIGS. 10 and 12, first, the photodiode PD (in the semiconductor substrate treatment step 101 shown in FIG. 20) and the multi-layer wiring layer MW (in the multi-layer wiring formation step 102) or the like are formed on the side of the surface 1a (first main surface) of the wafer 1. Note that in this case, the antireflection film AR is not normally provided on the surface 1a of the wafer 1. Regardless of this timing, the photodiode PD or the like may be formed at any appropriate timing.

As shown in FIG. 21, for example, when the insulating film 11 under the pad layer in the multi-layer wiring layer MW is formed, the wafer 1 is turned upside down. Then, for example, the surface 1a (first main surface) of the wafer 1 is attached to a support substrate 29 via an adhesive layer 28 (in the support substrate attaching step 103 shown in FIG. 20). The backside 1b (the second main surface) of the wafer 1 is subjected to backside grinding, CMP process, chemical etching, and the like as needed. In this way, the thickness of the part of the semiconductor substrate 1s in the wafer 1 is thinned, for example, up to about several micrometers (in a backside grinding step 104 shown in FIG. 20).

Then, as shown in FIG. 22, the antireflection film AR (having a thickness of, for example, about 90 nm) is deposited over the backside 1b (the second main surface) of the wafer 1, for example, by the plasma CVD or the like. The antireflection film AR can preferably include a multi-layer film comprised of, for example, a silicon nitride film, a silicon oxide film, and the like.

Then, a silicon oxide-based insulating film (e.g., TEOS-SiO$_2$ film) is deposited as the insulating film 26 under the shielding metal film (insulating film under the light shielding film), over the antireflection film AR, for example, by the plasma CVD or the like (in an insulating film deposition step 105 under the light shielding film as shown in FIG. 20). The thickness of the insulating film 26 under the shielding metal film can preferably be, for example, approximately 200 nm.

Then, the shielding metal film 25 (light shielding film) is deposited (in a thickness of, e.g., about 200 nm) over the insulating film 26 under the shielding metal film, for example, by sputtering or the like (in a light shielding film deposition step 106 shown in FIG. 20). For example, the light shielding film is patterned by normal lithography (in a light shielding film processing step shown in FIG. 20). The shielding metal film 25 can preferably include a metal film, such as an aluminum film, or a tungsten film. Note that the deposition method of the shielding metal film 25 may obviously be not only the sputtering, but also the CVD. Suitable materials for the shielding metal film may include, in addition to aluminum and tungsten, copper and other metals. A film having a light shielding effect may be made of material other than metal (e.g., a metal oxide, a metal nitride, and the like).

Then, a silicon oxide-based insulating film (e.g., TEOS-SiO$_2$ film) is deposited as the passivation film 27 over the shielding metal film (passivation film over the light shielding film) to be positioned over the shielding metal film 25 and the insulating film 26 under the shielding metal film, for example, by the plasma CVD or the like (in an insulating film deposition step 108 over the light shielding film as shown in FIG. 20). The thickness of the passivation film 27 over the shielding metal film can preferably be, for example, approximately 500 nm. Thereafter, the planarizing process is performed as needed. The planarizing process can preferably be, for example, a CMP process. Obviously, the planarizing process is not essential.

Note that the passivation film 27 over the shielding metal film may be not only a single layer film, such as a silicon oxide-based insulating film, but also a silicon nitride-based insulating film, such as a silicon nitride film, with the single layer film added thereto, or a composite film comprised of a lower-layer silicon oxide film (silicon oxide-based insulating film), and an upper-layer silicon nitride film (silicon oxide-based insulating film).

Then, the far-ultraviolet ray irradiation step 102*d* shown in FIG. 20 is performed, for example, using the ultraviolet ray irradiation device 50 shown in FIG. 23. Referring to FIG. 23, the outline of the ultraviolet ray irradiation device 50 and the far-ultraviolet ray irradiation step 102*d* will be described below. As shown in FIG. 23, during the far-ultraviolet ray irradiation step 102*d*, the wafer 1 to be processed is mounted, for example, with its backside 1*b* facing upward, on the wafer stage 55 installed in the wafer processing chamber 53. The lamp chamber 52 is provided above the wafer processing chamber 53 via the transparent partition 51 (for example, quartz glass etc.). For example, the plurality of far ultraviolet lamps 54 is installed in the lamp chamber 52. In the far-ultraviolet ray irradiation process, for example, atmosphere gas 57 for the far-ultraviolet ray irradiation process is supplied to the wafer processing chamber 53 via the gas supply port 56, and air is exhausted from the wafer processing chamber to the outside via the vacuum exhaust system 58 with the vacuum pump 59. The wafer processing chamber 53 is kept, for example, in the predetermined decompressed state. Note that obviously, the decompressed state is not essential.

By way of example, conditions for the far-ultraviolet ray irradiation process are as follows. That is, for example, light source: far ultraviolet lamp (see FIG. 28), radiation intensity: about 2000 watt/m2, irradiation time: about 300 seconds, wafer backside temperature: ordinary temperature (in irradiation, the temperature sometimes increases by about several tens of degrees), atmospheric pressure of the processing chamber: about 13 kPa, and gas atmosphere: nitrogen.

The timing of the far-ultraviolet ray irradiation process is performed together with the heat treatment step 102*e* after deposition of the passivation film 27 over the shielding metal film, which is convenient in terms of the process. Alternatively, the far-ultraviolet ray irradiation process may be performed at any other timing. For example, the far-ultraviolet ray irradiation process is performed before deposition of the passivation film 27 over the shielding metal film, which is particularly effective from the viewpoint of recovery of defects or the like. When the passivation film 27 over the shielding metal film is a composite film, for example, the far-ultraviolet ray irradiation process may be performed in the midstream of the deposition, specifically, between the depositions of the lower-layer silicon oxide film (silicon oxide-based insulating film) and the upper-layer silicon nitride film (silicon nitride-based insulating film).

Then, the heat treatment step 102*e* shown in FIG. 20 is performed, for example, using the heat treatment device 60 shown in FIG. 24. Referring to FIG. 24, the outline of the heat treatment device 60 and the heat treatment step 102*e* will be described below. As shown in FIG. 16, during the heat treatment step 102*e*, the wafer 1 to be processed is mounted, for example, with its backside 1*b* facing upward, on the wafer stage 55 installed in the wafer processing chamber 53. The lamp chamber 52 is provided above the wafer processing chamber 53 via the transparent partition 51 (for example, quartz glass etc.). For example, a plurality of heating lamps 64 (for example, infrared lamps) is installed in the lamp chamber 52. In the heat treatment after the far-ultraviolet ray irradiation process, for example, the atmosphere gas 57 for the heat treatment is supplied to the wafer processing chamber 53 via a gas supply port 56, and then air is exhausted to the outside via the vacuum exhaust system 58 with the vacuum pump 59. The wafer processing chamber 53 is kept, for example, at ordinary pressure. Note that obviously, the ordinary pressure is not essential.

By way of example, conditions for the heat treatment are as follows. That is, for example, wafer backside temperature: about 420° C., atmospheric pressure in the processing chamber: ordinary pressure, gas atmosphere: hydrogen forming gas (of approximately 95% nitrogen and 5% hydrogen), and heat treatment time: about 30 minutes.

The timing of the heat treatment step is performed after deposition of the passivation film 27 over the shielding metal film, which is effective from the viewpoint of recovery of defects and the like. Alternatively, the heat treatment may be performed at any other timing. For example, the heat treatment may be performed before deposition of the passivation film 27 over the shielding metal film, or in the midstream of the deposition of the passivation film 27 (composite film) over the shielding metal film. The case of performing the heat treatment in the midstream means that when the passivation film 27 over the shielding metal film is comprised of, for example, the lower-layer silicon oxide film (silicon oxide-based insulating film), the intermediate-layer silicon nitride film (silicon nitride-based insulating film), and the upper-layer silicon oxide film (silicon oxide-based insulating film), the heat treatment may be performed, for example, between the depositions of the silicon nitride film and the upper-layer silicon oxide film.

After the ultraviolet ray irradiation step and the post-ultraviolet ray irradiation heat treatment, as shown in FIGS. 25 and 26, in the pixel region and the pad formation region, for example, a polyimide resin film or the like is deposited, e.g., by coating to form the organic planarizing insulating film 24 (having a thickness of, e.g., about 800 nm).

Then, as shown in FIG. 25, in the pixel region, the color filter layer 14 is formed, for example, over the organic planarizing insulating film 24 (in the color filter layer formation step 121 shown in FIG. 20). Thereafter, the microlens layer 15 is formed over the color filter layer 14 in the pixel region (in the microlens layer formation step 122 shown in FIG. 20)

Then, as shown in FIG. 26, the pad opening 18 is formed in the pad formation region leading from the backside 1b (second main surface) of the wafer 1 up to the bonding pad 19 comprised of the third metal wiring layer WM3, for example, by combination of normal lithography and dry etching etc. Note that the pad opening or the like may be formed before the ultraviolet ray irradiation step, or at any other timing.

Thereafter, the side of the surface 1a (first main surface) of the wafer 1 is attached to, e.g., a dicing tape, etc., and subjected to the dicing process to be divided into individual chips 2 as needed. Then, an assembly process (for example, chip bonding, wire bonding, sealing, or the like) is performed as appropriate.

7. Supplemental explanation and general consideration of the above-mentioned embodiments (including modified examples) (see mainly FIGS. 27 to 30)

Figure 27:
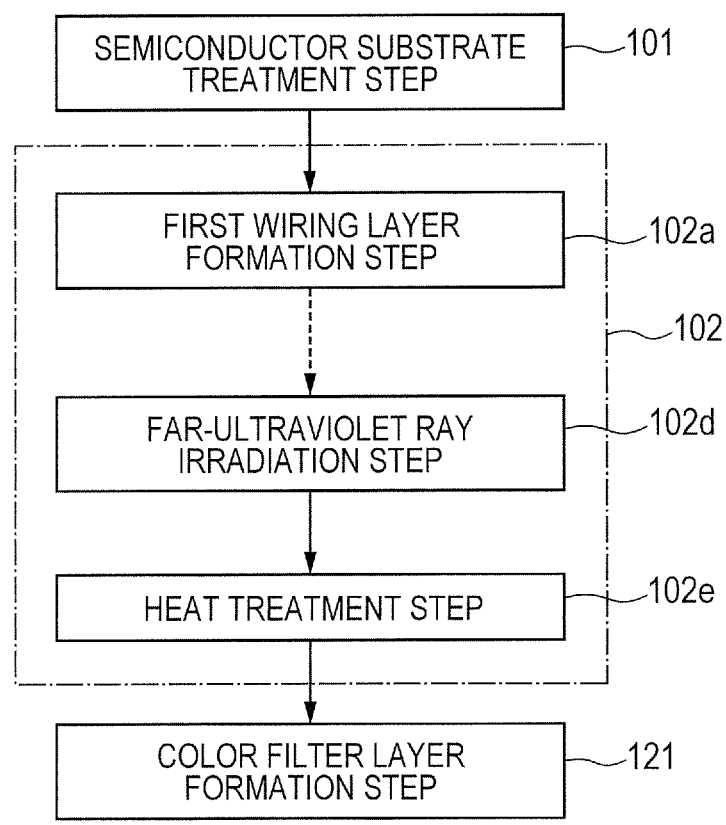
FIG. 27 is a process block flowchart for explaining the outline of the manufacturing method of the semiconductor integrated circuit device in the one embodiment of the present application.
Figure 28:
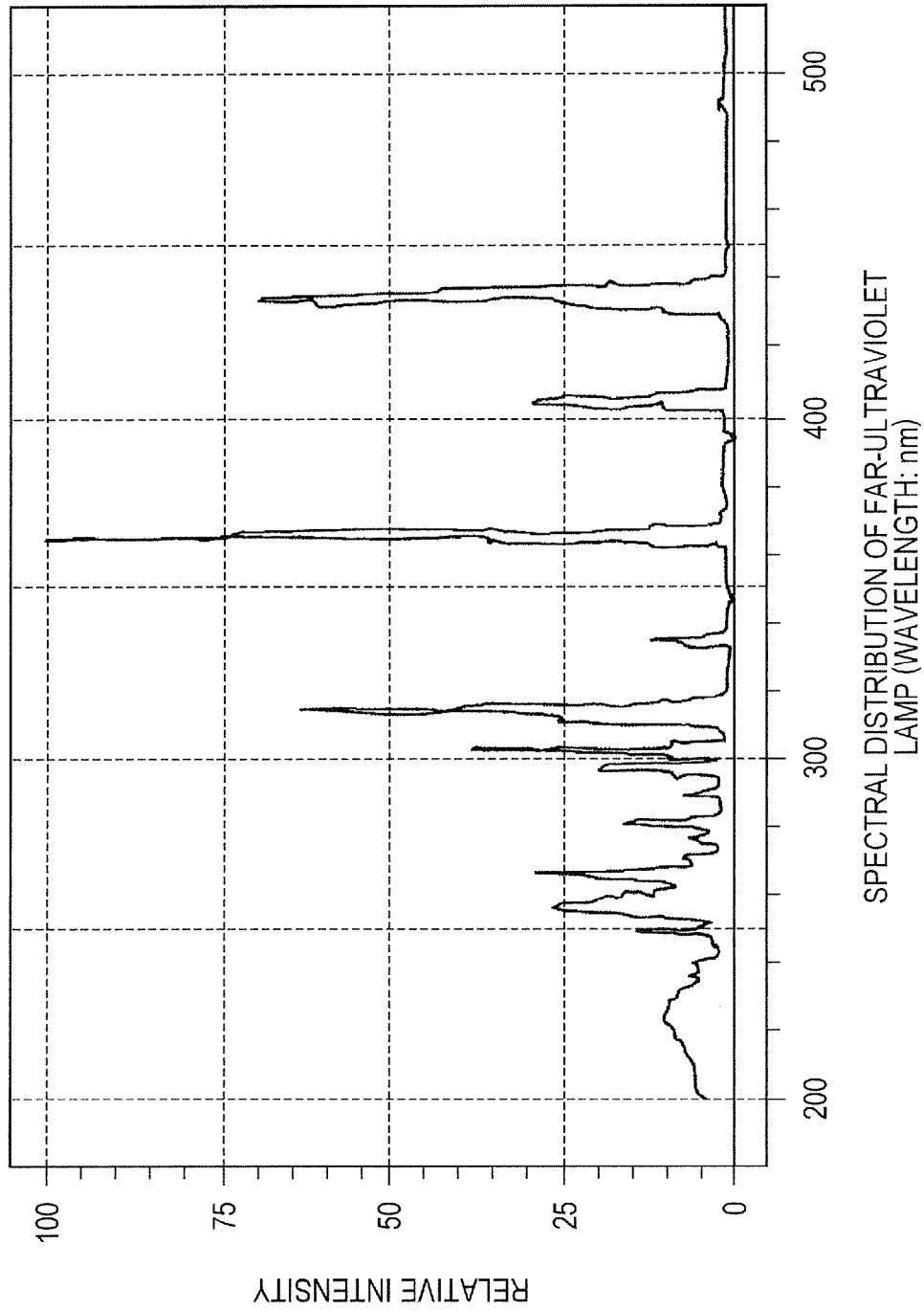
FIG. 28 is a spectrum distribution diagram of one example of a far ultraviolet lamp used in the far-ultraviolet ray irradiation step 102d shown in FIGS. 9 and 20.
Figure 29:
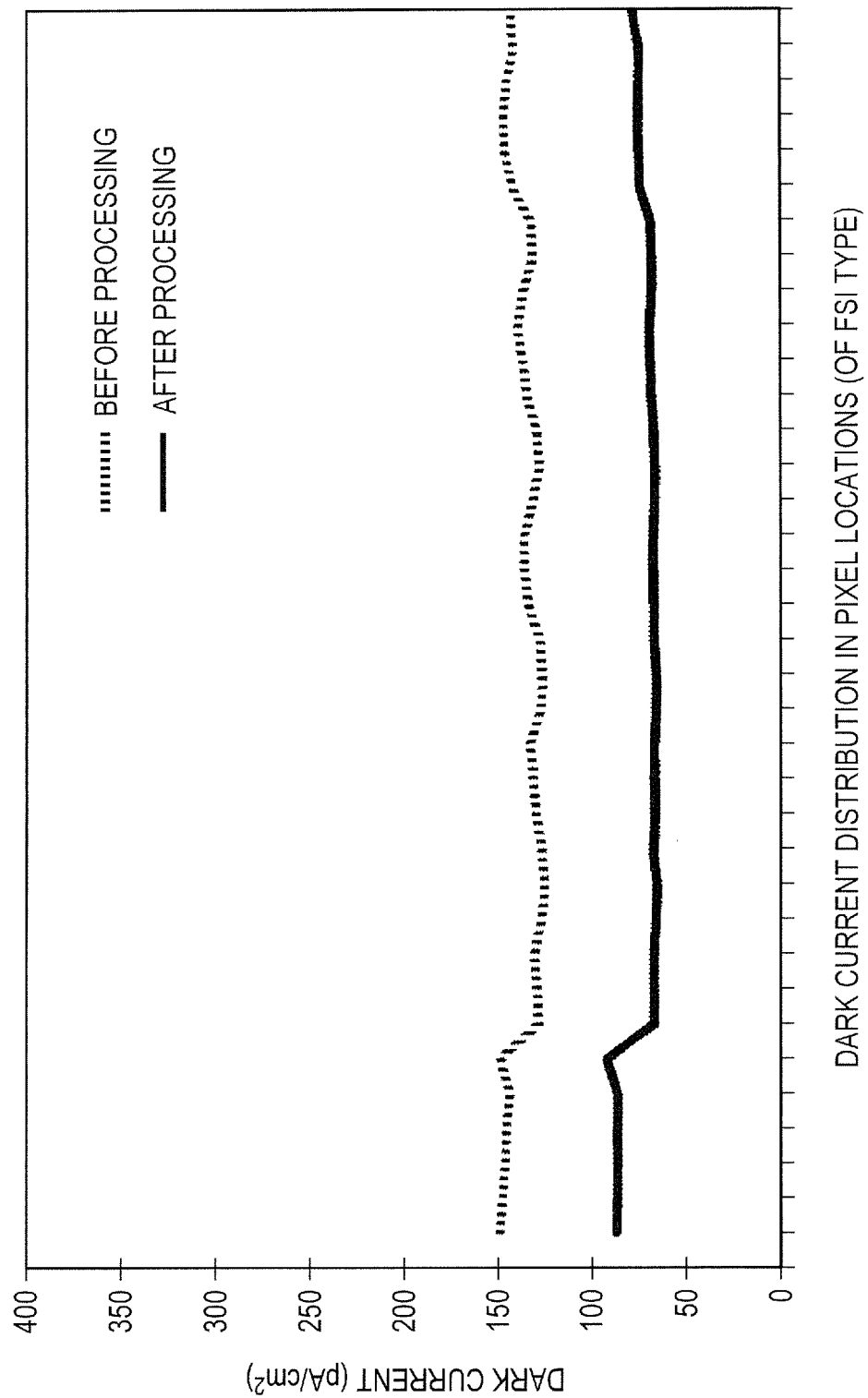
FIG. 29 is a plot diagram of distribution of dark current in pixel locations before and after the far-ultraviolet ray irradiation step 102d and the heat treatment step 102e shown in FIG. 9.
Figure 30:
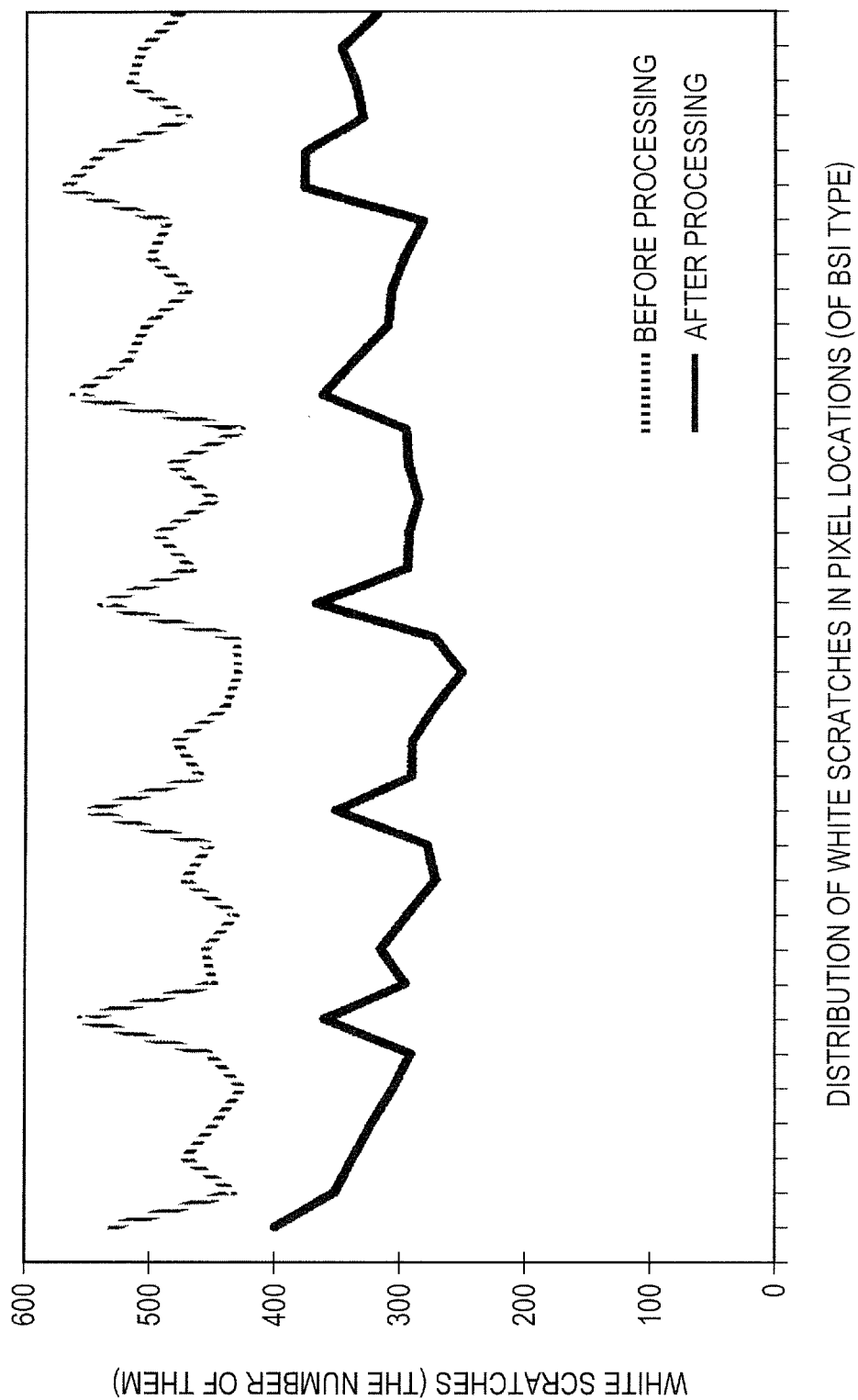
FIG. 30 is a plot diagram of distribution of the number of white scratches in pixel locations before and after the far-ultraviolet ray irradiation step 102d and the heat treatment step 102e shown in FIG. 20.

FIG. 27 is a process block flowchart for explaining the outline of the manufacturing method of the semiconductor integrated circuit device in the one embodiment of the present application. FIG. 28 is a spectrum distribution diagram of one example of a far ultraviolet lamp used in the far-ultraviolet ray irradiation step 102d shown in FIGS. 9 and 20. FIG. 29 is a plot diagram of distribution of dark current in pixel locations before and after the far-ultraviolet ray irradiation step 102d and the heat treatment step 102e shown in FIG. 9. FIG. 30 is a plot diagram of distribution of the number of white scratches in pixel locations before and after the far-ultraviolet ray irradiation step 102d and the heat treatment step 102e shown in FIG. 20. Referring to these figures, the supplemental explanation and general consideration of the above-mentioned embodiments (including modified examples) will be given below.

(1) Supplementary explanation and consideration regarding technical problems and the like: As mentioned above, in the solid-state imaging element, dark current occurs due to influences of an interface state at an interface between a semiconductor and an insulating film, for example, between silicon and silicon oxide, and of charges generated in a device manufacturing process. The dark current causes signal noise, thereby disadvantageously degrading the function of the device, specifically, the display quality.

In general, it is considered that the amount of various types of crystal defects, the amount of charges, and the interface level (hereinafter collectively referred to as an "interface level etc.") are increased due to the influence of the ultraviolet ray accompanied by the dry etching or the like using the plasma, which is widely used in the device manufacturing process.

However, the studies by the inventors of the present application have shown that the irradiation with ultraviolet rays increases parts of the interface levels etc., but decreases other parts of the interface levels etc . It also shows that even the increase in the interface levels of the parts can be recovered by the following heat treatment (terminating effect or the like, including dangling bond with hydrogen).

(2) Explanation of the outline of the manufacturing method of the semiconductor integrated circuit device according to the one embodiment of the present application (see mainly FIG. 27): Therefore, the outline of the manufacturing method of the semiconductor integrated circuit device in the one embodiment of the present application is illustrated in FIG. 27, that is, a manufacturing method of a semiconductor integrated circuit device including the following steps: (a) providing a semiconductor wafer with numerous chip regions, the semiconductor wafer having numerous photodiodes formed in a matrix at a semiconductor region in a first main surface of the semiconductor wafer in each of the chip regions so as to configure a surface-irradiation type image sensor in step 101; (b) after the step (a), forming a multi-layer wiring layer over the first main surface of the semiconductor wafer in step 102; and (c) after the step (b), forming a color filter layer over the multi-layer wiring layer in step 121. Here, the step (b) includes the following sub-steps. That is, the step (b) includes the steps of: (b1) forming a first wiring layer included in the multi-layer wiring layer in step 102a; (b2) after the step (b1), irradiating the first main surface of the semiconductor wafer with far-ultraviolet ray in step 102d; and (b3) after the step (b2), applying a heat treatment to the semiconductor wafer in step 102e.

In this way, the dark current and the like in the image sensor can be reduced.

The combined use of the ultraviolet ray irradiation and the heat treatment can manufacture the solid-state imaging element of high quality with little dark current and few white scratches.

(3) Supplementary explanation (see mainly FIGS. 28, 29, and 30) regarding conditions or the like for the far-ultraviolet ray irradiation step 102d (see FIGS. 9 and 20): Conditions for the far-ultraviolet ray irradiation step 102d will be further explained below with reference to FIGS. 9 and 20 (or FIG. 27).

That is, (3-1) Irradiance: A suitable irradiance of ultraviolet ray in the far-ultraviolet ray irradiation step 102d can be about 2000 W/m$^2$, by way of example.

A suitable range of irradiance can be in a range of 1500 to 2500 w/m$^2$ by way of example.

A practicable range of irradiance can be in a range of 1000 to 4000 w/m2 in terms of mass production by way of example.

Note that it is apparent that the irradiance is closely related to the irradiation time, and thus the irradiance does not exclude any value outside the above-mentioned range.

(3-2) Irradiation Time: A suitable irradiation time of ultraviolet ray in the far-ultraviolet ray irradiation step 102d can be about 300 seconds by way of example.

A suitable range of the irradiation time can be in a range of 30 to 600 seconds by way of example.

A practicable range of the irradiation time can be in a range of 10 to 1000 seconds in terms of mass production, by way of example.

Note that it is apparent that the irradiation time is closely related to the irradiance, and thus the irradiation time does not exclude any value outside the above-mentioned range.

(3-3) Atmospheric pressure (process pressure) of irradiation process atmosphere: A suitable atmospheric pressure of the irradiation process atmosphere in the far-ultraviolet ray irradiation step 102d (atmospheric pressure of the processing chamber, hereinafter referred to as a simply "process pressure") can be about 13 kpa by way of example. That is, the far-ultraviolet ray irradiation is desirably performed under reduced-pressure atmosphere.

A suitable range of a process pressure can be equal to or more than about 1 kpa, and less than about 70 kpa, by way of example.

A practicable range of the process pressure can be, for example, in a range from 0.1 kpa up to approximately the ordinary pressure (including a slight positive pressure).

It is apparent that the process pressure does not exclude the use of a high vacuum outside the above-mentioned range, and a pressurized state, as needed.

Thus, the reason why the reduced pressure is preferable is to prevent the ultraviolet rays from being absorbed in the atmospheric gas.

(3-4) Gas atmosphere: A suitable gas atmosphere of the processing chamber in the far-ultraviolet ray irradiation step 102d can be, for example, a non-oxidizing atmosphere. Examples of the non-oxidizing atmospheres can include a gas atmosphere containing as a principle element, an inert gas (including argon, helium, etc.), a nitrogen gas, or a gas etc. (water vapor, hydrogen gas, etc.) that generates a hydrogen radical, like an ammonia gas. The inert gas and the nitrogen gas have the merit of high safety. The gas that generates hydrogen radicals has the merit of contributing to the recovery of the interface level etc., at the same time as the irradiation of the ultraviolet rays.

Note that after coating with the passivation film etc. (when the oxidation is not problematic across a wide area), the far-ultraviolet ray irradiation step may be performed in the atmosphere, that is, under an atmosphere including air etc.

(3-5) Spectral distribution of ultraviolet rays from a far ultraviolet lamp (far ultraviolet light source): FIG. 28 shows a spectral distribution of ultraviolet rays in one example of the far ultraviolet lamp (far ultraviolet light source) usable in the above-mentioned embodiments.

As can be seen from the studies by the inventors of the present application, a range of wavelength that can reduce dark current corresponds to a range (far-ultraviolet region) belonging to a far-ultraviolet ray having mainly a wavelength of equal to or more than 200 nm, and less than 300 nm. Taking into consideration optical energy, the far-ultraviolet ray having a wavelength of 200 nm or more, and less than 250 nm is very effective in terms of recovery of defects or the like.

As shown in FIG. 28, an emission spectrum of a far ultraviolet lamp generally includes a mixture of line spectra and a continuous spectrum covering a wide wavelength range of 100 nm or more (vacuum-ultraviolet region), and less than 440 nm (near-ultraviolet region).

For the purpose of reducing the dark current, setting of the intensity of the entire far-ultraviolet region higher than that of the entire vacuum-ultraviolet region is particularly effective. On the other hand, the influence of a relatively strong line spectrum in the near-ultraviolet region is considered to be relatively small. Thus, the light in the vacuum-ultraviolet region may be blocked or attenuated by a filter or the like if necessary.

Note that light sources for the far-ultraviolet rays can include, in addition to the far ultraviolet lamp, a normal ultraviolet lamp, an ultraviolet laser, and the like.

(3-6) Wafer temperature in irradiation process (temperature of the wafer surface, or a backside temperature in the backside-irradiation type): The far-ultraviolet ray irradiation step 102d is normally performed by setting the wafer stage at the ordinary temperature (which includes the case of not controlling specifically). However, the surface temperature of the wafer is slightly increased by irradiation of the ultraviolet rays.

Note that setting the temperature of the wafer stage higher than the ordinary temperature has the effect of recovery of defects.

(4) Supplementary explanation regarding the heat treatment step 102e (see FIGS. 9 and 20), that is, conditions for post-annealing and the like (see mainly the figures): Conditions for the heat treatment step 102e shown in FIGS. 9 and 20 (or FIG. 27) or the like will be further explained.

That is, (4-1) Heat treatment temperature: A suitable heat treatment temperature (surface temperature of the wafer) in the heat treatment step 102e can be, for example, about 420° C.

A suitable range of the heat treatment temperature can be, for example, equal to or more than about 380° C., and less than about 440° C.

Further, a practicable range of a heat treatment temperature can be, for example, equal to or more than about 300° C., and less than about 450° C. in terms of mass production.

(4-2) Heat treatment atmosphere: A suitable gas atmosphere for the heat treatment in the heat treatment step 102e can be, for example, a reducing gas atmosphere. The suitable reducing gas atmosphere can include, for example, a reducing layer atmosphere in which a hydrogen gas atmosphere (atmosphere containing hydrogen as a principal element) contains, as a principal reducing gas component, a hydrogen forming gas atmosphere (gas containing hydrogen as a principal component except for inert gas and nitrogen gas, for example, a mixed gas containing 95% nitrogen and 5% hydrogen), that is, a hydrogen gas as a principal reducing gas component.

As described below, hydrogen which is required to recover defects etc., is also supplied from the silicon nitride-based insulating film or the like. The heat treatment atmosphere is not necessary a reducing gas atmosphere or the like.

(4-3) Atmospheric pressure (process pressure) of heat treatment atmosphere: Ordinary pressure is used as the atmospheric pressure of the heat treatment chamber in the heat treatment step 102e, which is convenient in terms of process, and alternatively a decompressed pressure or a pressure in a pressurized state can also be used.

(4-4) Heat treatment time or the like: The heat treatment time differs depending on the heat treatment temperature, whether or not high-speed annealing, such as microwave annealing, lamp annealing, or laser annealing, is used, or whether or not the normal resistance heating annealing (hereinafter referred to "normal heating") is used. The normal heating will be mainly described below by way of example. That is, a suitable heat treatment time in the heat treatment step 102e can be, for example, about 30 minutes.

A suitable range of the heat treatment time can be, for example, in a range of 15 to 60 minutes.

Further, a practicable range of the heat treatment time can be, for example, in a range of 8 to 180 minutes in terms of mass production.

A suitable range of the heat treatment time in the high-speed annealing can be, for example, in a range of about 10 seconds to 5 minutes.

(5) Supplemental explanation and general consideration regarding various variations in the above-mentioned embodiments (including modified examples): (5-1) Supply of hydrogen from a silicon nitride-based insulating film: For example, before the far-ultraviolet ray irradiation step 102*d* shown in FIGS. 9 and 20 (or FIG. 27), a silicon nitride-based insulating film, such as a silicon nitride film formed by the plasma CVD, is sometimes already formed on the light irradiation side as the sensor (on the side of the front surface in the surface-irradiation type, or on the side of the backside in the backside-irradiation type). In such a case, the silicon nitride film supplies hydrogen required for the heat treatment step 102*e*, and thus the heat treatment atmosphere is not necessarily reducible. It is apparent that the hydrogen supply becomes more effective in combination with the reducing atmosphere.

At this time, this effect becomes greater in use of a silicon nitride film (silicon nitride-based insulating film) whose hydrogen content is large, that is, a highly-dehydrogenated silicon nitride film, as compared to a normal one (a silicon nitride film dehydrogenated in the normal amount)

For a reference, a description will be given of respective examples of conditions for manufacturing the normally dehydrogenated silicon nitride film and the highly dehydrogenated silicon nitride film.

That is, the conditions for plasma CVD of the silicon nitride film dehydrogenated in the normal amount are, for example, as follows: gas flow rate: $SiH_4/NH_3/N_2$=about 400/200/20000 sccm, wafer stage preset temperature: about 400° C., process pressure: about 1 kpa, high frequency power: about 100 w. On the other hand, the conditions for plasma CVD of the silicon nitride film dehydrogenated in the high amount are, for example, as follows: gas flow rate: $SiH_4/NH_3/N_2$=about 50/1000/1200 sccm, wafer stage preset temperature: about 400° C., process pressure: about 1 kpa, high frequency power: about 100 w.

(5-2) Timing or the like of the far-ultraviolet ray irradiation step and heat treatment step (post-annealing step): It is effective to perform the far-ultraviolet ray irradiation step after all wiring layers (including the pad wiring layer) are formed. However, the far-ultraviolet ray irradiation step may be performed every time each wiring layer is formed (including the case of performing the far-ultraviolet ray irradiation step every time wiring layers are selectively formed). Every time the wiring layer is formed (including the case of performing the far-ultraviolet ray irradiation step every time the wiring layers are selectively formed), at least the post-annealing step is performed after the last far-ultraviolet ray irradiation step.

The far-ultraviolet ray irradiation step is effectively performed before formation of the glass coating, such as a plasma silicon nitride film, but may be performed after the glass coating formation.

The post-annealing step is effectively performed after formation of the glass coating, such as a plasma silicon nitride film, but may be performed before the glass coating formation.

(6) Effects of far-ultraviolet ray irradiation and heat treatment: FIG. 29 shows the comparison of dark current distribution between before and after the far-ultraviolet ray irradiation and heat treatment (which are combined to be referred to as a "reduction process of dark current etc.,") in the pixel region of the surface-irradiation type image sensor in the example of section 4.

FIG. 30 shows the comparison of distribution of white scratches between before and after the reduction process of dark current etc., in the pixel region of the backside-irradiation type image sensor in the example of section 6.

Note that in the backside-irradiation type image sensor, the backside grinding and the like may disadvantageously introduce numerous defects. Thus, the effects of the far-ultraviolet irradiation and heat treatment (dark current reduction effect, white scratch number decreasing effect, and the like) are considered to be great.

8. Summary Although the invention made by the inventors have been specifically described based on the embodiments, it is obvious that the invention is not limited to the embodiments, and various modifications and changes can be made to those embodiments without departing from the scope of the invention.

For example, in the above-mentioned embodiments, specifically, the use of the copper-based embedded wiring has been mainly described as the multi-layer wiring by way of example. However, it is obvious that any multi-layer wiring using an embedded wiring other than copper, or an aluminum-based non-embedded wiring may be used.

In the above-mentioned embodiments, specifically, the provision of the CMOS image sensor region has been mainly described as an image sensor region of the semiconductor integrated circuit device by way of example. However, it is apparent that not only the CMOS image sensor region, but also any other image sensor region in other forms, such as a CCD image sensor region, may be used.

Further, in the above-mentioned embodiments, the semiconductor chip on which a combination of the image sensor region and another circuit region is mounted has been specifically described by way of example. However, it is obvious that the semiconductor chip most of which is occupied by the image sensor region may be used.

Although in the above-mentioned embodiments, the semiconductor integrated circuit device using the silicon semiconductor substrate (including a SiGe substrate, a SOI substrate, and the like) has been specifically described by way of example, it is obvious that a semiconductor integrated circuit device using any other semiconductor substrate (e.g., GaAs substrate) or any other insulating substrate may be applied.

What is claimed is:

1. A method for manufacturing a semiconductor integrated circuit device, comprising the steps of:
    (a) providing a semiconductor wafer with numerous chip regions, the semiconductor wafer having numerous photodiodes formed in a matrix at a semiconductor region in a first main surface of the semiconductor wafer in each of the chip regions so as to configure a surface-irradiation type image sensor;
    (b) after the step (a), forming a multi-layer wiring layer over the first main surface of the semiconductor wafer; and
    (c) after the step (b), forming a color filter layer over the multi-layer wiring layer,
    wherein the step (b) comprises sub-steps of:
    (b1) forming a first wiring layer included in the multi-layer wiring layer;
    (b2) after the step (b1), irradiating the first main surface of the semiconductor wafer with far-ultraviolet ray; and
    (b3) after the step (b2), applying a heat treatment to the semiconductor wafer.

2. The method for manufacturing a semiconductor integrated circuit device according to claim 1,
    wherein the far-ultraviolet ray has a wavelength range of less than 250 nm.

3. The method for manufacturing a semiconductor integrated circuit device according to claim 2, wherein the step (b2) is performed under reduced-pressure atmosphere.

4. The method for manufacturing a semiconductor integrated circuit device according to claim 3,
wherein a range of atmospheric pressure under the reduced-pressure atmosphere is equal to or more than 1 kilopascal and less than 70 kilopascals.

5. The method for manufacturing a semiconductor integrated circuit device according to claim 4,
wherein a range of a treatment temperature of the heat treatment is equal to or more than 300° C. and less than 450° C.

6. The method for manufacturing a semiconductor integrated circuit device according to claim 5,
wherein the heat treatment is performed under a reducing atmosphere containing hydrogen as a principal reducing gas component.

7. A method for manufacturing a semiconductor integrated circuit device, comprising the steps of:
(a) providing a semiconductor wafer with numerous chip regions, the semiconductor wafer having numerous photodiodes arranged in a matrix in each of the chip regions so as to configure a backside-irradiation type image sensor;
(b) forming a multi-layer wiring over a first main surface of the semiconductor wafer;
(c) after the steps (a) and (b), forming a first insulating film over a second main surface of the semiconductor wafer;
(d) after the step (c), depositing a light shielding film over the first insulating film;
(e) patterning the light shielding film;
(f) after the step (e), forming a second insulating film over the second main surface of the semiconductor wafer; and
(g) forming a color filter layer over the second insulating film,
wherein the step (f) includes sub-steps of:
(f1) depositing the second insulating film;
(f2) patterning at least the second insulating film;
(f3) after the step (f2), irradiating the second main surface of the semiconductor wafer with far-ultraviolet ray; and
(f4) after the step (f3), applying a heat treatment to the semiconductor wafer.

8. The method for manufacturing a semiconductor integrated circuit device according to claim 7,
wherein the far-ultraviolet ray has a wavelength range of less than 250 nm.

9. The method for manufacturing a semiconductor integrated circuit device according to claim 8,
wherein the step (f3) is performed under reduced-pressure atmosphere.

10. The method for manufacturing a semiconductor integrated circuit device according to claim 9,
wherein a range of atmospheric pressure under the reduced-pressure atmosphere is equal to or more than 1 kilopascal and less than 70 kilopascals.

11. The method for manufacturing a semiconductor integrated circuit device according to claim 10,
wherein a range of a treatment temperature of the heat treatment is equal to or more than 300° C. and less than 450° C.

12. The method for manufacturing a semiconductor integrated circuit device according to claim 11,
wherein the heat treatment is performed under a reducing atmosphere containing hydrogen as a principal reducing gas component.

* * * * *